United States Patent [19]
Maruyama

[11] Patent Number: 5,808,956
[45] Date of Patent: Sep. 15, 1998

[54] BUS-LINE DRIVE CIRCUIT AND SEMICONDUCTOR STORAGE DEVICE COMPRISING THE SAME

[75] Inventor: Akira Maruyama, Suwa, Japan

[73] Assignee: Seiko Epson Corporation, Tokyo, Japan

[21] Appl. No.: 769,272

[22] Filed: Dec. 18, 1996

[30] Foreign Application Priority Data

Dec. 20, 1995 [JP] Japan ................................... 7-332201

[51] Int. Cl.$^6$ ................................................ G11C 8/00
[52] U.S. Cl. .............................. 365/230.06; 365/230.03; 365/194
[58] Field of Search ........................ 365/230.03, 230.06, 365/194; 326/81

[56] References Cited

U.S. PATENT DOCUMENTS 5,442,307   8/1995   Shigehara et al. ........................ 326/81

OTHER PUBLICATIONS

"Data–Dependent Logic Swing Internal Bus Architecture for Ultralow–Power LSI's", Mitsuru Hiraki et al., *IEEE Journal of Solid–Sate Circuits*, Apr. 1995: vol. 30, No. 4, pp. 397–402.

*Primary Examiner*—David C. Nelms
*Assistant Examiner*—Trong Phan
*Attorney, Agent, or Firm*—Oliff & Berridge, PLC

[57] ABSTRACT

A bus-line drive circuit comprises an inverter INV1 formed of a PMOS transistor Q1 and an NMOS transistor Q2 having gates to which internal read data $d_o$ is input, a delay circuit DL that receives an output signal from the inverter INV1, a PMOS transistor Q7 and an NMOS transistor Q8 that receive an output signal from the inverter INV1, and a depletion-mode NMOS transistor DQ1 that receives an output from the delay circuit DL. When the level of the internal read data $d_o$ goes high, the signal potential applied to the gate of the depletion-mode NMOS transistor DQ1 remains high, so that the bus line $L_o$ can be charged by a large current supply capability. The bus line $L_o$ is subsequently discharged gradually by the delay circuit DL. This operation ensures that the potential of the bus line $L_o$ gradually falls to a fixed value which is less than the power supply voltage $V_{DD}$ and does not rise any further because the gate potential of the depletion-mode NMOS transistor DQ1 is made to be low by the delay circuit, thus enabling a lower power consumption, higher speeds, and a low voltage margin.

20 Claims, 7 Drawing Sheets

BUS-LINE DRIVE CIRCUIT AND SEMICONDUCTOR STORAGE DEVICE COMPRISING THE SAME

BACKGROUND OF THE INVENTION

1. Field of the Invention

This invention relates to a drive circuit that drives a bus line having a large load capacitance and load resistance, and to a semiconductor storage device comprising such a drive circuit.

2. Description of Related Art

A recent aim of research has been to reduce the power consumption during operation of semiconductor storage devices, as well as logic circuits in which such device are installed. One means of doing so when driving a signal line that has a large load capacitance, such as a bus line, is to restrain the charging and discharging currents with respect to that load capacitance, using the method described below, That is, a power supply voltage is supplied through external terminals, and a voltage lower than that power supply voltage is created within the semiconductor storage device and supplied to internal circuits such as a memory array. Thus the internal circuits are driven by a lower voltage, restraining the current consumption of the entire device.

A circuit in which the clock line capacitance and amplitude are halved and the clock power is reduced to a quarter is disclosed in the IEEE Journal of Solid-State Circuits, Vol . 30, No. 4, p. 397, April 1995. In this circuit, sufficiently large, equal capacitances are provided between the power supply voltage ($V_{DD}$) and ground voltage (GND), the capacitance of the clock line is halved thereby, and two inverters that configure the driver circuit operate at different voltages.

In other words, this circuit outputs an inverter signal which operates an inverter provided on the side of the power supply terminal between the power supply voltage $V_{DD}$ and a voltage that is $V_{DD}/2$ and also operates an inverter provided on the side of the ground terminal between $V_{DD}/2$ and the ground voltage GND. This configuration reduces the signal amplitude and thus reduces the power consumed by charging and discharging a bus line within the chip.

As circuits become larger and more highly integrated, the number of transistors on each chip is increasing and thus research is progressing into reducing the power supply voltage itself, in order to reduce the power consumption. Semiconductor storage devices that used to have specified power supply voltages of 5 V are now tending to have power supply voltages of 3.3 V, as the trend towards lower voltages progresses. However, the threshold voltage of MOS transistors, for example, raises an obstacle to this trend towards lower voltages. That is, the threshold voltage $V_{thn}$ of a MOS transistor is becoming larger in comparison the power supply voltage $V_{DD}$, so it is difficult to guarantee the operating margin for the transistor. If $V_{DD}$ is 5 V and $V_{thn}$ is 0.7 V, for example, $V_{thn}$ is 14% of the power supply voltage. In contrast, if $V_{DD}$ is 3.3 V and $V_{thn}$ is 0.7 V, $V_{thn}$ is approximately 21.2% of the power supply voltage.

In other words, the construction of a semiconductor storage device with a lower specified power supply voltage $V_{DD}$ raises problems such as operating failures as the output voltage drops and a decrease in the charging/discharging speed of the bus lines as the current supply capability of the MOS transistors drops while they are conductive.

The rapid access speeds of static RAM ensures that it is often used as cache memory within devices that require the rapid speeds of computers. Such a static RAM has peripheral circuits configured of CMOS transistors, but the configuration of the memory cells may cause the power consumption of the internal circuitry, such as the memory array, to increase. That is why there is currently a large interest in reducing the power consumption of static RAM to less than that of dynamic RAM.

Dynamic RAM is inexpensive and provides large storage capacities, so it is used in a wide range of application fields as the main storage device of computers and as image memory. However, the data in the memory cells of a dynamic RAM is overwritten by a refresh operation at fixed time intervals, and the charging and discharging during this refresh consumes current. In case of a dynamic RAM of a battery backup type, therefore, a current topic of research is to develop the dynamic RAM that consumes less power. Dynamic RAM is used in many applications because it can be fabricated inexpensively and it can also be highly integrated, but there is still a demand for dynamic RAM that operates as fast as static RAM. That is why there is interest in increasing the speed and reducing the power consumption of dynamic RAM.

There are currently various research projects aimed at reducing the power consumption and increasing the speed of semiconductor storage devices. A particular problem concerns the bus lines of a semiconductor storage device which are made of a material such as aluminum or polysilicon but are extremely long and hence have large load resistances and load capacitances. It is difficult to modify the circuit layout to remove this elongated wiring, and changing the wiring material to reduce the resistance is currently difficult because it would affect the characteristics of the device.

SUMMARY OF THE INVENTION

An objective of this invention is to provide a bus-line drive circuit that enables a reduction in current consumption and also makes it possible to guarantee a margin for a low-voltage operation and enable an increase in operating speed. It also provides a semiconductor storage device in which such a bus-line drive circuit is installed.

The bus-line drive circuit in accordance with a first aspect of this invention comprises a transistor of a first conductivity type, a transistor of a second conductivity type, and a bus line;

wherein a depletion-mode transistor of the second conductivity type is connected between the drain of the transistor of the first conductivity type and one end of the bus line;

wherein the one end of the bus line is connected to the drain of the transistor of the second conductivity type; and wherein a voltage that is less than a power supply voltage and greater than the threshold voltage of the depletion-mode transistor of the second conductivity type is applied to the gate of the depletion-mode transistor of the second conductivity type.

With this bus-line drive circuit, the potential of the bus line is dependent only on the threshold voltage of the depletion-mode transistor and is not affected by the power supply voltage, so that the power supply voltage can be reduced and thus the circuit can operate stably even when the power supply voltage is set to be low. The charging and discharging of the bus lines can be done rapidly and the power consumption is reduced.

The following are preferred examples of this bus-line drive circuit:

(a) A signal that is input to the gate of the transistor of the first conductivity type is delayed to be input to the gate of the depletion-mode transistor of the second conductivity type.

(b) A signal of approximately the same phase as a signal that is input to the gate of the transistor of the first conductivity type is input to the gate of the depletion-mode transistor of the second conductivity type, A bus-line drive circuit in accordance with a second aspect of this invention comprises a transistor of a first conductivity type, a transistor of a second conductivity type, and a bus line;

wherein a depletion-mode transistor of the second conductivity type is connected between the drain of the transistor of the first conductivity type and one end of the bus line;

wherein the one end of the bus line is connected to the drain of the transistor of the second conductivity type; and wherein one of a ground voltage and other voltage which is lower than a power supply voltage is supplied to the gate of the depletion-mode transistor of the second conductivity type.

A bus-line drive circuit in accordance with a third aspect of this invention comprises a transistor of a first conductivity type, a transistor of a second conductivity type, and a bus line;

wherein the drain of the transistor of the first conductivity type, the drain of the transistor of the second conductivity type, and one end of the bus line are connected together;

wherein a depletion-mode transistor of the second conductivity type is connected between the source of the transistor of the first conductivity type and a power supply terminal; and wherein a voltage that is less than a power supply voltage and greater than the threshold voltage of the depletion-mode transistor of the second conductivity type is applied to the gate of the depletion-mode transistor of the second conductivity type.

A bus-line drive circuit in accordance with a fourth aspect of this invention comprises a transistor of a first conductivity type, a transistor of a second conductivity type, and a bus line;

wherein the drain of the transistor of the first conductivity type is connected to the drain of the transistor of the second conductivity type;

wherein a depletion-mode transistor of the second conductivity type is connected between the drain of the transistor of the first conductivity type and one end of the bus line; and wherein a signal that is input to the gate of the transistor of the first conductivity type is then delayed to be input to the gate of the depletion-mode transistor of the second conductivity type.

This depletion-mode NMOS transistor is preferably set to have a power supply capability for driving a plurality of bus lines.

Each of the above described bus-line drive circuits of this invention is used as appropriate for the bus lines in a semiconductor storage device such as static RAM or dynamic RAM.

It is preferable that such a semiconductor storage device comprises a sense amplifier and a data input buffer; wherein the bus-line drive circuit is provided at an output stage of the sense amplifier or at an output stage of the data input buffer.

It is also preferable that in such a semiconductor storage device, the bus-line drive circuit is used as a power supply circuit for supplying a voltage that is lower than a power supply voltage to the bus line.

The data output buffer comprised within this semiconductor storage device preferably comprises a circuit for receiving read data transferred from the sense amplifier and converting the voltage amplitude of the read data.

DESCRIPTION OF PREFERRED EMBODIMENT

Embodiment 1

Figure 1:
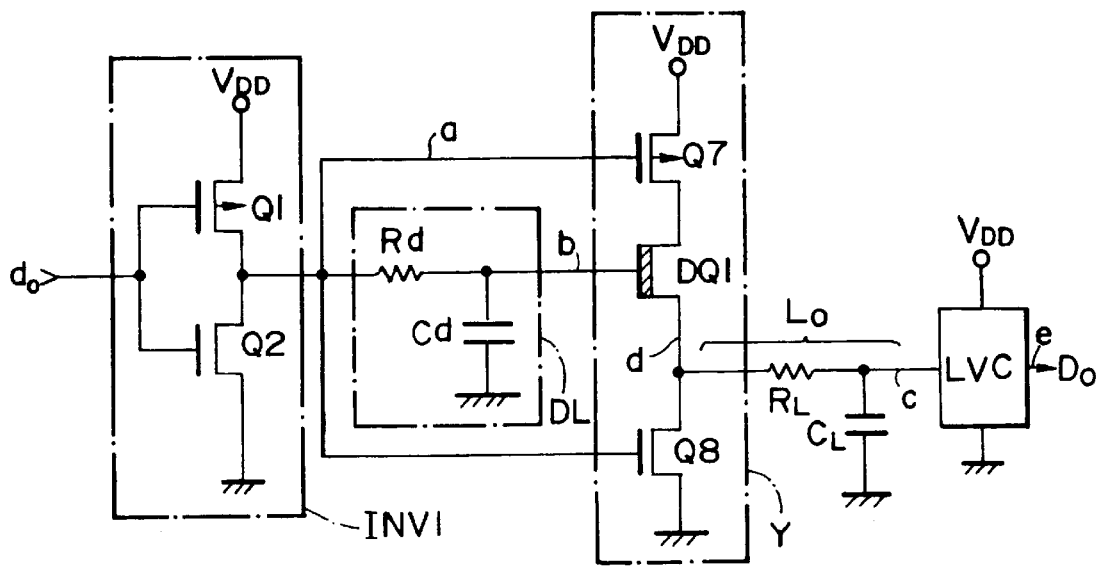
FIG. 1 is a schematic view of a bus-line drive circuit that is Embodiment 1 of this invention.

The bus-line drive circuit in accordance with the first embodiment of this invention is shown in FIG. 1. In this figure, a circuit Y comprising a PMOS transistor Q7, a depletion-mode NMOS transistor DQ1, and an NMOS transistor Q8 is used as a bus-line drive circuit for data output that is connected to an end portion of the bus line $L_o$ on the side of internal circuitry (a memory array), for example. This circuit Y could equally well be used as a bus-line drive circuit for data input that is connected to an end portion of the bus line $L_o$ on the side of an input buffer. The description below concerns the use of the bus-line drive circuit of this invention as a bus-line drive circuit for data output, to correspond to the comparative example shown in FIG. 2. A number of these bus-line drive circuits would be provided in practice to correspond to the number of bus lines (n lines) within a semiconductor storage device, but the description below concerns only the drive circuit for a bus line $L_o$. To further simplify the description, the power supply voltage $V_{DD}$ is assumed to be 5 V and the ground potential GND is assumed to be 0 V, but it should be noted that these voltages are not limited to these values. The description also refers to MOS transistors by way of example, but it could equally refer to MIS transistors and it should be clear that any other type of active element having a similar function could be used, without departing from the scope of this invention. Similarly, the description below concerns the conductivity of PMOS transistor as a first conductivity and the conductivity of NMOS transistor as a second conductivity, simply for the sake of convenience.

The configuration of the bus-line drive circuit in accordance with this first embodiment of the invention will now be described. The bus-line drive circuit comprises an inverter INV1, formed of a PMOS transistor Q1 and an NMOS transistor Q2 having gates which are connected and to which the internal read data $d_o$ is input; a delay circuit DL which receives an output signal from the inverter INV1; the PMOS transistor Q7 and the MMOS transistor Q8 having gates which also receive the output signal from the inverter INV1; and the depletion-mode NMOS transistor DQ1 which receives an output from the delay circuit DL.

In this embodiment, the power supply voltage $V_{DD}$ is applied to the source of the PMOS transistor Q7 and the ground voltage GND is applied to the source of the NMOS transistor Q8. The depletion-mode NMOS transistor DQ1 is provided between the drain of the PMOS transistor Q7 and the drain of the NMOS transistor Q8. A line d that is a connection between the source of the depletion-mode NMOS transistor DQ1 and the drain of the NMOS transistor Q8 is connected to the bus line $L_o$. In this embodiment, the bus line $L_o$ is elongated as described above, so that a load capacitance $C_L$ and load resistance $R_L$ are inevitably created therein.

The signal that is output to this elongated bus line $L_o$ is input to a level conversion circuit LVC where it is converted in such a manner that the signal at line c has an amplitude between the $V_{DD}$ and the GND levels and is then output as the read data $D_o$. This read data $D_o$ is output from the data output terminal (not shown in the figure) and is thus transferred to the external device.

The delay circuit DL could be formed of a resistor $R_d$ and capacitor $C_d$, for example. In such a case, the resistor $R_d$ and capacitor $C_d$ could be formed in an inactive region of a semiconductor chip, using elongated wiring formed of a conductive layer of a material such as polysilicon.

Instead of being configured of a resistor and capacitor as described above, the delay circuit DL could be formed of an even number of series-connected CMOS inverter circuits, each consisting of a PMOS transistor and an NMOS transistor. In that case, these inverter circuits are effective for controlling the chip area, and a delay circuit having a predetermined delay time can be fabricated by adjusting the dimensions of the channel width and length of each of the PMOS and NMOS transistors. These CMOS inverter circuits are accurate and are particularly effective for adjusting the delay time. If, for example, an even number of CMOS inverter circuits are connected in series and fuses are provided between a plurality of these CMOS inverter circuits, the CMOS inverter circuits can be formed on the chip and then the number of delay steps and the delay time can be adjusted by trimming these fuses to match the required specifications Since the depletion-mode NMOS transistor DQ1, which receives an output signal from the delay circuit at the gate thereof, has different timings at which it turns on and off, depending on the channel widths and lengths, it is preferable to set the delay time appropriate to this on/off timing.

Figure 3:
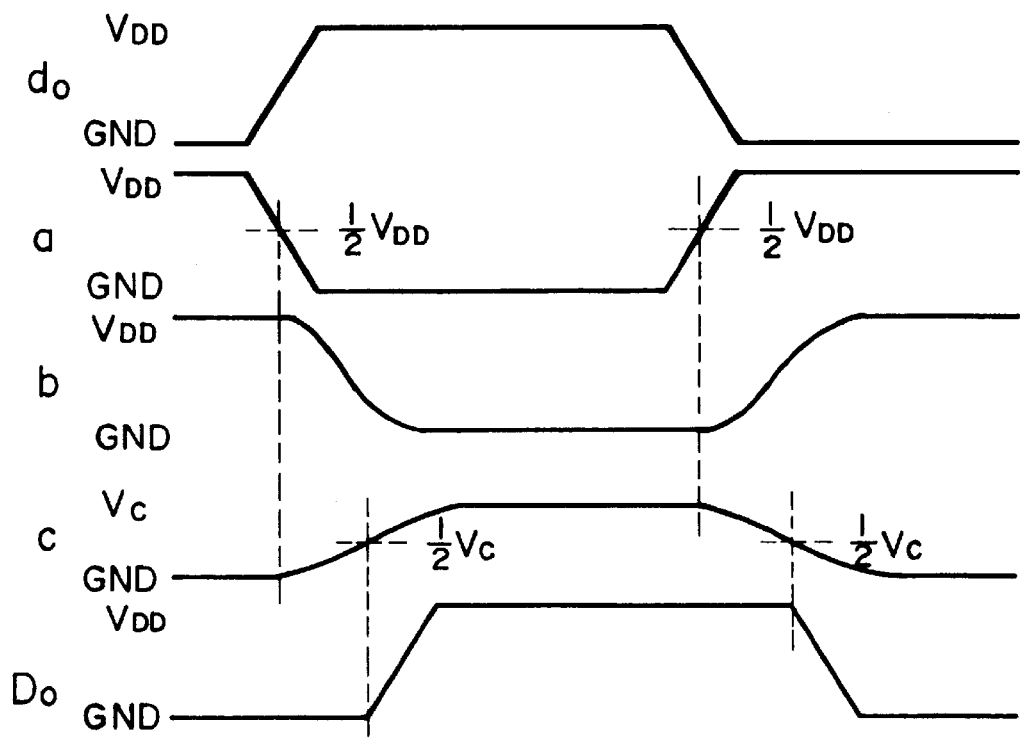
FIG. 3 is an operating waveform chart of the bus-line drive circuit of Embodiment 1 of this invention.
Figure 4:
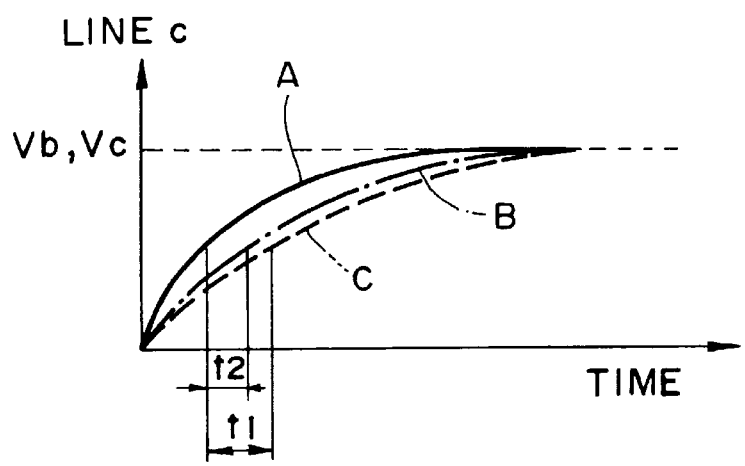
FIG. 4 is a graph of the relationship between the potential level at a line c and time, in the bus-line drive circuits of Embodiments 1 and 2.

The operation of the bus-line drive circuit shown in FIG. 1 will now be described, with reference to an operating waveform chart (vertical axis: voltage (V), horizontal axis: time) shown in FIG. 3, a graph in FIG. 4 showing the relationship between voltage (vertical axis, V) and time (horizontal axis) of line c of FIG. 1, and a circuit diagram of the level conversion circuit LVC in FIG. 5, in addition to FIG. 1. Note that the current supply capabilities of the PMOS transistor Q1 and the NMOS transistor Q2 are assumed to be the same, for convenience. Similarly, the total current supply capability of the serially connected PMOS transistor Q7 and depletion-mode NMOS transistor DQ1 is assumed to be the same as the current supply capability of the NMOS transistor Q8.

The description first concerns the case in which the potential level of the internal read data $d_o$ changes from low to high. The change in level of the potential of the internal read data $d_o$ from low (GND=0 V) to high ($V_{DD}$=5 V) turns the PMOS transistor Q1 off and the NMOS transistor Q2 on. Since the output signal of the inverter INV1 becomes low, the potential of line a goes low in correspondence with the rise of the potential of the internal read data $d_o$.

When the potential of line a falls, the PMOS transistor Q7 turns on and the NMOS transistor Q8 turns off. This brings the potential of the drain of the PMOS transistor Q7 to $V_{DD}$.

The output signal from the inverter INV1 is delayed by a predetermined time in the delay circuit DL, and this delayed signal is transferred to a line b. In other words, the potential of line b is still high at the fall of the potential of line a, so that the potential of the source of the depletion-mode NMOS transistor DQ1 is pulled up to the potential of the drain thereof, that is, to the level of $V_{DD}$, as shown in FIG. 3. In other words, a signal which is at the power supply voltage $V_{DD}$ level is applied for the predetermined delay time to the gate of the depletion-mode NMOS transistor DQ1 immediately after the change in the voltage level of the internal read data $d_o$, ensuring that the depletion-mode NMOS transistor DQ1 has a large current supply capability and thus the bus line $L_o$ can be charged rapidly. Note that the relationship between this delay time and the depletion-mode NMOS transistor DQ1 will be described later in detail.

The potential of line b subsequently falls towards substantially the same level as line a, that is, to ground potential, so that this ground potential starts to be applied to the gate of the depletion-mode NMOS transistor DQ1, and the bus line $L_o$ is sufficiently charged. As the potential of line b falls, the potentials of lines d and c rise, but this rise in potential of lines d and c halts when the current supply capability of the depletion-mode NMOS transistor DQ1 fails. The current supply capability of a depletion-mode NMOS transistor DQ1 is determined by the relationship between the potentials of the source and gate thereof, and the current supply capability of DQ1 finally becomes zero. During this time, the potentials VC on lines d and c become substantially the same value as $V_{thd}$, that is, the absolute value of the threshold voltage (for example: 1.5 V of the depletion-mode transistor DQ1) of the depletion-mode NMOS transistor DQ1, and the potential does not rise any further.

If the threshold voltage of the first-stage circuit Within the level conversion circuit LVC is set to be at Vc/2, and when the potential of line c rises past Vc/2, the level conversion circuit LVC converts the potential into high level, that is, the level of the power supply voltage $V_{DD}$ and then outputs that signal as the read data $D_o$ from the data output terminal (not shown in the figure) and is thus transferred to the external device. The graph in FIG. 4 depicts the line C (the speed of changing within circuit A) in FIG. 1 as A and FIG. 6 as B. Since the speed of charging of line c is faster by t1 than that of the comparative example of FIG. 2, as shown in FIG. 4, the read data $D_o$ also rises faster.

The characteristics of the depletion-mode NMOS transistor DQ1 will now be discussed. The absolute value $V_{thd}$ of the threshold voltage of a depletion-mode NMOS transistor is set to be low by some method such as controlling the impurity density in the channel thereof, which means that this channel is conductive even when the gate potential VG is 0 V. In other words, since the channel region can be sufficiently inverted by the potential within the gate junction.

Thus, if the power supply voltage $V_{DD}$ is applied to the drain and the gate of this transistor, the source potential is at the same voltage level as the power supply voltage $V_{DD}$.

Conversely, if the power supply voltage $V_{DD}$ is applied to the drain and the ground voltage GND is applied to the gate, the source potential is at the same voltage level as the absolute value $V_{thd}$ of the threshold voltage.

Similarly, if the power supply voltage $V_{DD}$ Is applied to the drain and a positive voltage Vx that is less than the power supply voltage $V_{DD}$ is applied to the gate, the source potential is at a voltage that is the absolute value $V_{thd}$ of the threshold voltage plus the voltage Vx.

That is, when $V_{DD}$ is greater than $V_{thd}$, the potential at the source of this depletion-mode NMOS transistor DQ1 is not affected by the drain potential, it is dependent only on the gate potential VG and the absolute value $V_{thd}$ of the threshold voltage of the depletion-mode NMOS transistor DQ1.

As described above, the potential Vc of line c in the circuit of this embodiment is dependent only on the absolute value $V_{thd}$ of the threshold voltage of the depletion-mode NMOS transistor DQ1 and is not affected by the power supply voltage $V_{DD}$. Therefore, it is possible to reduce the power supply voltage, thus enabling stable circuit operation even when the power supply voltage is designed to be lower. All of the bus lines can also be charged or discharged rapidly and the power consumption can be reduced.

The description now concerns a case in which the voltage level of the internal read data $d_o$ goes low.

The change in level of the potential of the internal read data $d_o$ from high ($V_{DD}$=5 V) to low (GND=0 V) turns the PMOS transistor Q1 on and the NMOS transistor Q2 off. Since the output signal or the inverter INV1 becomes high, the potential of line a goes high in correspondence with the falling of the potential of the internal read data $d_o$.

Since the potential of line a goes high, the PMOS transistor Q7 turns off and the NMOS transistor Q8 turns on. Therefore, the charge on the bus line $L_o$ rapidly discharges through the NMOS transistor Q8 so that the potentials of lines d and c go to ground.

If the threshold voltages of the transistors in the first-stage circuit Within the level conversion circuit LVC are set to be at Vc/2, and when the potential of line c falls to less than Vc/2, the level conversion circuit LVC converts the potential of line c into low level (that is, ground potential 0 V), and then outputs the signal from the data output terminal (not shown in the figure) as read data $D_o$, for transfer to the external device.

The relationship between delay time and the structure of the depletion-mode NMOS transistor DQ1 will now be discussed. The potential determination level set by this delay time is described with reference to the comparative example of FIG. 2 and the circuit of FIG. 1.

In this case, the load resistance $R_L$ of the bus line $L_o$ in the circuit of the comparative example is assumed to be zero ohm and the gate input is calculated as a step function. In the formulae below, the potential of the bus line is V, the load capacitance is C, the absolute value of the threshold voltage of the PMOS transistor Q9 is $V_{thd}$ the time of the boundary between saturation region and non-saturation region is tc, the time until the determination level is reached is t, frequency is F, current is I, the current amplification factor of the PMOS transistor Q9 is $\beta_p$, and the current amplification factor of the depletion-mode NMOS transistor DQ1 of FIG. 1 is βDe. Since I=CVF, CV (=I/F) can be obtained from Formula 1:

$$CV = \int_0^{tc} \frac{1}{2} \beta_p (V_{DD} - V_{thp})^2 dt + \int_{tc}^{t} \beta_p \left\{ (V_{DD} - V_{thp})(V_{DD} - V) - \frac{1}{2}(V_{DD} - V)^2 \right\} dt \quad (1)$$

Formula 2 is obtained by solving Formula 1 to obtain the delay time tp of the PMOS transistor Q9:

$$t_p = \frac{C}{\beta_p} \left\{ \frac{2V_{thp}}{(V_{DD} - V_{thp})^2} + \frac{1}{(V_{DD} - V_{th})} \ln \frac{(V_{DD} + 2V_{th} - V)}{(V_{DD} - V)} \right\} \quad (2)$$

With the circuit of FIG. 1, on the other hand, the bus line $L_o$ is assumed to have no load resistance $R_L$, the gate input is assumed to be a step function, and the power supply voltage $V_{DD}$ is applied to the gate of the depletion-mode NMOS transistor DQ1 with a delay. The delay time of the PMOS transistor Q7 connected to the drain of the depletion-mode NMOS transistor DQ1 is ignored, and changes in the absolute value $V_{thd}$ of the threshold voltage due to the body effect of the depletion-mode NMOS transistor DQ1 are also ignored. CV (=I/F) can be obtained from Formula 3:

$$CV = \int_0^t \beta_{DE} \left\{ (V_{DD} - V + V_{thd})(V_{DD} - V) - \frac{1}{2}(V_{DD} - V)^2 \right\} dt \quad (3)$$

In this case, the depletion-mode NMOS transistor DQ1 is always in a non-saturated state, so this formula is valid.

This formula can be solved to derive the delay time for the depletion-mode NMOS transistor DQ1, giving Formula 4:

$$t_{de} = \frac{C}{\beta_{DE} \cdot V_{thd}} \ln \frac{V_{DD}(V_{DD} + 2V_{thd} - V)}{(V_{DD} + 2V_{thd})(V_{DD} - V)} \quad (4)$$

Formula 2 and Formula 3 can be used to determine the conditions under which the time taken to reach the determination level is the same. In such a case, substituting $V=V_{DD}/2$ into Formula 2 and $V=2 V_{thd}/2$ into Formula 4 gives tp=tde, so that the delay tr can be obtained from Formula 5:

$$tr = \frac{C}{\beta_{DE} \cdot V_{thd}} \ln \frac{V_{DD}(2V_{DD} + 3V_{thd})}{(V_{DD} + 2V_{thd})(V_{DD} - V_{thd})} \quad (5)$$

$$= \frac{C}{\beta_p} \left\{ \frac{2V_{thp}}{(V_{DD} - V_{thp})^2} + \frac{1}{(V_{DD} - V_{thp})} \ln \frac{(3V_{DD} - 4V_{th})}{V_{DD}} \right\}$$

The delay can be set by solving this formula for βDe (where βDe<βπ).

$$R_G \cdot C_G = \alpha_{tr} \quad (6)$$

Incidentally, the relation among $R_G$, tr, and $C_G$ is shown in Formula 6. In Formula 6, $R_G$ is the value of Rd of the bus-line circuit of FIG. 1 and $C_G$ is the value of Cd thereof.

The delay circuit can apply the power supply voltage $V_{DD}$ to the gate of the depletion-mode NMOS transistor DQ1 when the potential level of the signal which is input to the preceding inverter INV1 is not $V_{DD}$ level.

$$Vb/Va = 1 - \exp\left(-\frac{t}{Cd \cdot Rd}\right) \quad (7)$$

In this case, the value of α is roughly on the order of 0.4 to 1.0. If, for example, the values of Rd and Cd of FIG. 1 are assumed to be lumped constants and charging continues until the potential Vb of line b is 90% of the potential Va of line a, taking Vb/Va in Formula 7 to be 0.9 and Cd×Rd=0.43t gives a value of α that is roughly 0.43. Using a distributed constant model with the same conditions and assuming that Cd×Rd=1.00t give a value of α that is roughly 1.00. Therefore, the value of α can be set for the delay tr of Formula 5.

Figure 5:
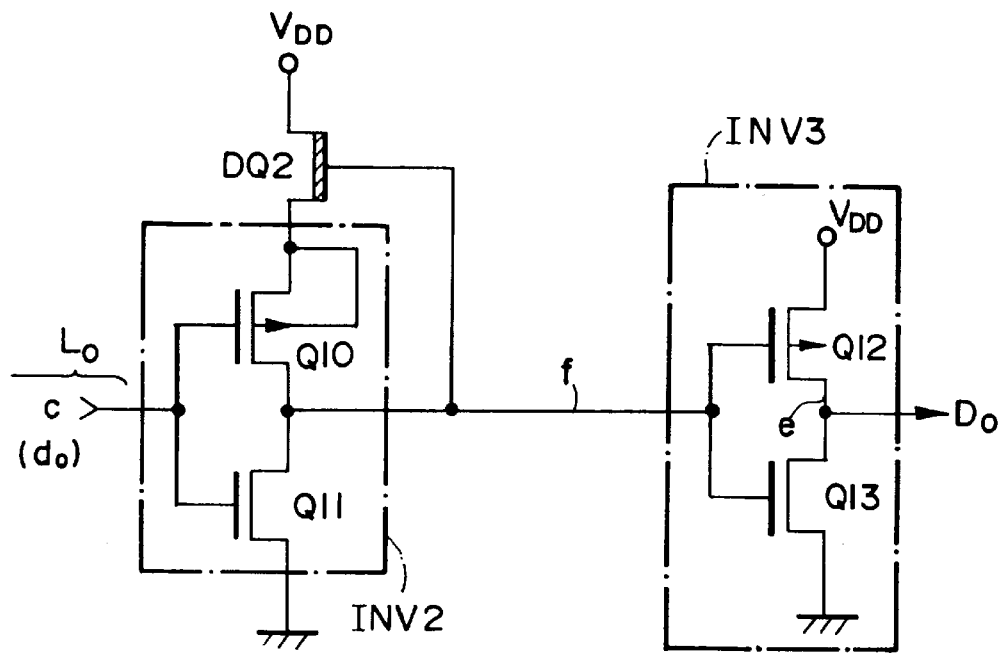
FIG. 5 is a schematic view of the level conversion circuit of this invention.

An example of the level conversion circuit LVC of this invention is shown in FIG. 5. This circuit is configured of an inverter INV2, a depletion-mode NMOS transistor DQ2 supplying power to the level conversion circuit LVC, and an inverter INV3 for shaterminalg the waveform of an output signal.

The inverter INV2 comprises a PMOS transistor Q10 and a NMOS transistor Q11, having gates and drains. The gates are connected with each other, and the drains are also connected with each other.

A signal that is output from a line f, which connects between the drains of the PMOS transistor Q10 and the NMOS transistor Q11, is applied to the gate of the depletion-mode NMOS transistor DQ2, the drain thereof is connected to the power supply voltage $V_{DD}$, and the source thereof is connected to the source of the PMOS transistor Q10.

Similarly, the inverter INV3 comprises a PMOS transistor Q12 and a NMOS transistor Q13, having gates and drains. The gates are connected each other, and the drains are also connected each other. The gate of the inverter INV2 receives a signal from line c of the bus line $L_o$ (shown in FIG. 1), that is, a signal corresponding to the internal read data $d_o$, and the inverter INV3 modifies the amplitude of this signal corresponding to the internal read data $d_o$ into an amplitude between the $V_{DD}$ and the GND levels to form the read data $D_o$. This read data $D_o$ is output from the data output terminal (not shown in the figure) for transfer to the external device.

The operation of the level conversion circuit LVC will now be described. The description first concerns a case in which the level of the internal read data da changes from low (GND=0 V) to high ($V_{DD}$=5 V), that is, in which the potential of line c of the bus line $L_o$ goes from low (GND) to the potential Vc (=$V_{thd}$). In this case, the PMOS transistor Q10 turns off and the NMOS transistor Q11 turns on, so that the potential of line f falls to low (ground potential). This low-level signal is input to the inverter INV3, turning the PMOS transistor Q12 on, so that read data $D_o$ at a high level, that is, at the level of the power supply voltage $V_{DD}$ is output from a line e. This high-level data $D_o$ is output from a data output terminal (not shown in the figure) and thus transferred to an external device.

The description now turns to a case in which the level of the internal read data $d_o$ changes from high ($V_{DD}$=5 V) to low (GND=0 V), that is, the potential of line c of the bus line $L_o$ changes from high ($V_{thd}$) to low (GND). In this case, the NMOS transistor Q11 turns off and the PMOS transistor Q10 turns on. The depletion-mode NMOS transistor DQ2 applies a voltage which is the gate potential thereof plus the absolute value $V_{thd}$ of the threshold voltage of the depletion-mode NMOS transistor DQ2 to the source of the PMOS transistor Q10. Therefore, the PMOS transistor Q10 turns on and the potential of line f gradually rises from GND until the potential of line f eventually reaches the level so the power supply voltage $V_{DD}$.

The signal output from line f is input to the inverter INV3 and the read data $D_o$ at the level of the ground voltage GND is output from line e through the data output terminal (not shown in the figure) for transfer to the external device.

During each of the data read and write operations, there is no constantly flowing current from the power supply voltage $V_{DD}$ through the depletion-mode NMOS transistor DQ2, the PMOS transistor Q10, and the NMOS transistor Q11 to GND within this level conversion circuit LVC, so there is no increase in the current consumption.

Incidentally, the bus-line drive circuit of this embodiment can also be applied to a data input portion, as mentioned above. It should be noted, however, that a low-amplitude voltage can be applied to the internal circuitry in such a case, so there is no need for the level conversion circuit LVC and the potential of the bus line $L_o$ can be supplied unchanged to the internal circuitry. In such a case, the internal read data $d_o$ of FIG. 1 corresponds to write data with a large signal amplitude and the read data $D_o$ corresponds to internal write data with a small signal amplitude. In other words, write data is supplied as $d_o$ to the gate of the inverter INV1 of FIG. 1, and INV1 drives the circuit Y comprising the PMOS transistor Q7, depletion-mode NMOS transistor DQ1, and NMOS transistor Q8, although this is not shown specifically in the figures. In the same manner as data read, a signal that is delayed by a predetermined time is transferred to the gate of the depletion-mode NMOS transistor DQ1. Since the potential of line c depends only on the absolute value of the threshold voltage of the depletion-mode NMOS transistor DQ1, it is not affected by the power supply voltage and thus it is possible to guarantee a low-voltage operating margin and drive the bus line rapidly.

Note that, although this embodiment has been described above with reference to the bus line $L_o$ alone, this description holds for each of n bus lines so that each line will operate in accordance with the potential level of data thereon The bus-line drive circuit of this embodiment is particularly effective when bus lines are to be charged and discharged in unison.

Figure 2:
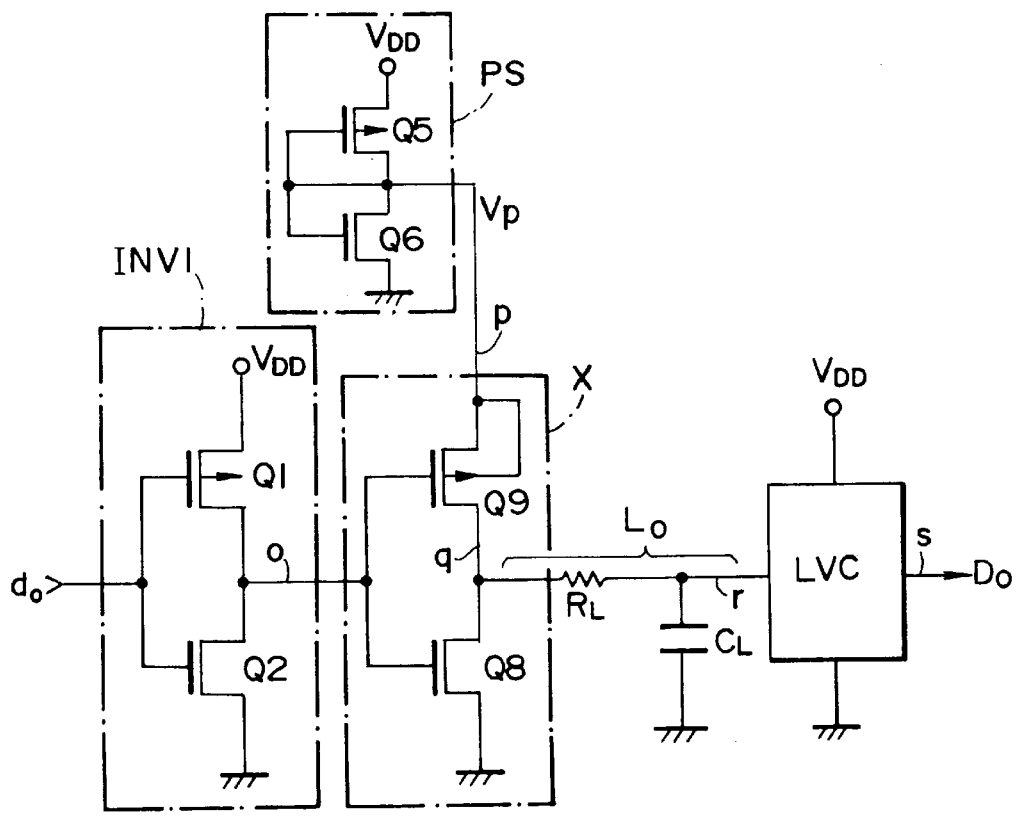
FIG. 2 is a schematic view of a bus-line drive circuit used as a comparative example in the research performed by the present inventors.

A bus-line drive circuit that was a comparative example investigated by the present inventors is shown in FIG. 2. A number of these bus-line drive circuits would be provided in practice to correspond to the number of bus lines (n lines) within a semiconductor storage device, but the description below concerns only the drive circuit for a single bus line $L_o$ of these n bus lines.

The bus-line drive circuit of FIG. 2 has a power supply circuit PS wherein the drains of a PMOS transistor Q5 and an NMOS transistor Q6 are connected and the same signal is supplied to the gates thereof. A power supply voltage $V_{DD}$ is applied to the source of this PMOS transistor Q5 and a ground voltage GND is applied to the source of the NMOS transistor Q6. This divides the power supply voltage $V_{DD}$ so that the potential of a line p is at a voltage $V_p$, which is lower than the power supply voltage $V_{DD}$. If, for example, the PMOS transistor Q5 and the NMOS transistor Q6 are configured to have equal current supply capabilities and the power supply voltage $V_{DD}$ is 5 V, the voltage $V_p$ will be approximately 2.5 V.

In the bus-line drive circuit in FIG. 2, a steady current flows through the power supply circuit PS configured of the PMOS transistor Q5 and the NMOS transistor Q6, and thus the current consumption is increased by an equivalent amount.

The potential $V_p$ of this line p is supplied to the source of a PMOS transistor Q9, where this source is short-circuited to the substrate of the transistor. The drain of the PMOS transistor Q9 and the drain of an NMOS transistor Q8 are connected by a line q, and the gates of these two transistors Q8 and Q9 are also connected.

There is a circuit X which is formed by connecting the PMOS transistor Q9 and the NMOS transistor Q8 in series. When this bus-line drive circuit is meant for data output, for example, the circuit X is connected to an end portion of the bus line $L_o$ on the side of the internal circuitry (memory arrays). When the bus-line drive circuit is meant for data input, the circuit X is connected to an end portion of the bus line $L_o$ on the side of an input buffer. The description below concerns the use of this comparative bus-line drive circuit as a bus-line drive circuit for data output.

In this case, an output signal from an inverter INV1 comprising a PMOS transistor Q1 and an NMOS transistor Q2 is input to the gates of the PMOS transistor Q9 and the NMOS transistor Q8. This inverter INV1 fetches internal read data $d_o$ from internal circuitry as an input signal and delivers that internal read data $d_o$ to the bus-line drive circuit.

An output signal from the circuit X comprising the PMOS transistor Q9 and NMOS transistor Q8 is output to a level conversion circuit LVC provided in a first stage of a data output section through the bus line $L_o$, which is extended to some distance from the line q.

Figure 10:
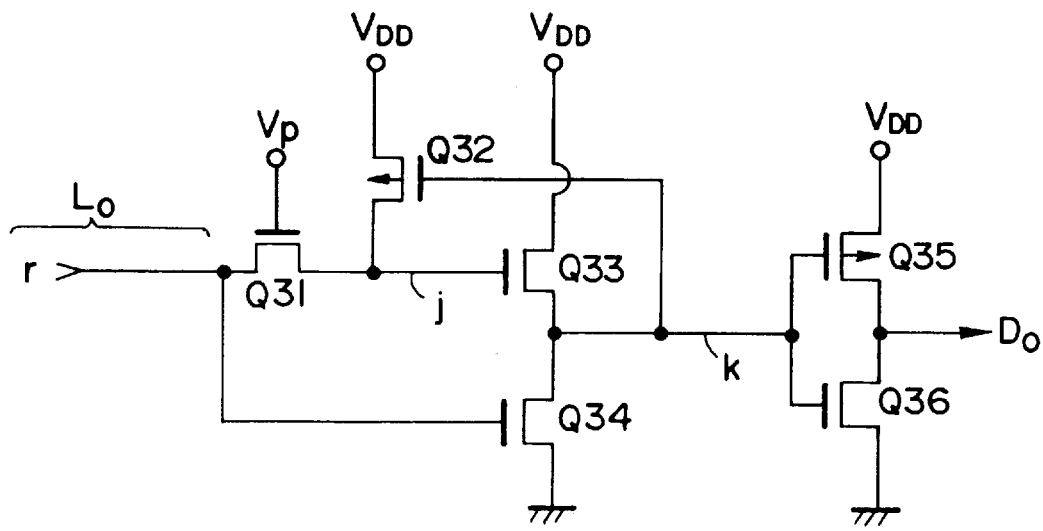
FIG. 10 is a schematic view of a conventional level conversion circuit.

The level conversion circuit LVC uses $V_{DD}$ as its power supply voltage. If the threshold voltage is set appropriately for transistors of a circuit at the input stage of the level conversion circuit LVC, a signal of an amplitude between $V_p$ and 0 V, which is output from line q on the bus line $L_o$, can be converted to have an amplitude between the $V_{DD}$ and the GND levels so that the voltage level can be modified to suit the input voltage of the external device that is connected thereto. That is, the amplitude of the signal that is output over the bus line $L_o$ is changed to an amplitude between the power supply voltage $V_{DD}$ and the ground voltage GND. This level conversion circuit LVC is shown in FIG. 10 and the configuration and operation thereof will be described later in detail. In this case, the external device could be a microprocessor or an interface circuit for a device such as a magnetic disk.

However, this bus line $L_o$ has to be made very long, as mentioned above, which means that a load capacitance $C_L$ and load resistance $R_L$ are created therein.

The operation of the circuit of FIG. 2 will now be described. The description first concerns a case in which the potential level of the internal read data $d_o$ changes from low to high.

This rise in the potential level of the internal read data $d_o$ turns the PMOS transistor Q1 off and the NMOS transistor Q2 on. This brings the potential of a line o to the level of the ground voltage GND (0 V).

A low-level output signal is then received from the inverter INV1, turning the PMOS transistor Q9 on and the NMOS transistor Q8 off. Thus the bus line $L_o$, which was at the ground voltage GND level, is charged to the potential $V_p(=V_{DD}/2=2.5$ V$)$.

The level conversion circuit LVC is affected by this change in potential of the bus line $L_o$, converts the output potential $V_p$ from the bus line $L_o$ to the power supply voltage $V_{DD}$ level, and outputs it as read data $D_o$. This read data $D_o$ is output from a data output terminal (not shown in the figure) of the semiconductor storage device via an output portion, and is thus transferred to an external device.

When the potential level of the internal read data $d_o$ goes low, on the other hand, the PMOS transistor Q1 turns on and the NMOS transistor Q2 turns off. Therefore, the potential of line o changes to the power supply voltage $V_{DD}$ level (5 V).

A high-level output signal is received from the inverter INV1, turning the PMOS transistor Q9 off and the NMOS transistor Q8 on. Thus the charge of line r of the bus line $L_o$, which was charged to the potential $V_p$, is discharged so that the potential of line r falls to the ground voltage GND.

The level conversion circuit LVC receives an output from the bus line $L_o$, outputs a signal at the ground voltage GND level as the read data $D_o$. This read data $D_o$ is output from the data output terminal (not shown in the figure) of the semiconductor storage device via the output portion, and is thus transferred to the external device.

The description now turns to the level conversion circuit LVC of FIG. 2, with reference to FIG. 10. The level conversion circuit of FIG. 10 comprises an NMOS transistor Q31 which receives the potential of line r of the bus line $L_o$ as an input signal, a PMOS transistor Q33 having a gate to which the output of the NMOS transistor Q31 is input, and an NMOS transistor Q34 having a gate to which the signal from line r is input. The drains of the PMOS transistor Q33 and the NMOS transistor Q34 are connected. The circuit also comprises a PMOS transistor Q32 having a gate to which the potential of line r is input, and the drain of the PMOS transistor Q32 is connected to the gate of the PMOS transistor Q33. The potential $V_p$ of FIG. 2 is applied to the gate of the NMOS transistor Q31. A signal is output from line k, and the signal is input to a CMOS inverter comprising a PMOS transistor Q35 and an NMOS transistor Q36, which outputs the read data $D_o$.

The operation of the level conversion circuit LVC of FIG. 10 will now be described. When a high-level signal, that is, one at the potential $V_p$ is input to line r, the NMOS transistor Q34 turns on which changes the potential of line k to the ground potential GND. Note that, when the potential of line k is at GND, the turning on of the PMOS transistor Q32 changes the potential of line j to $V_{DD}$, turning the PMOS transistor Q33 off. Since the potential applied to the gate of the NMOS transistor Q31 is the same potential $V_p$ as that of line r, that transistor Q31 turns off and thus a steady current does not flow from line j to line r.

Since level of line k is low, the PMOS transistor Q35 turns on and the NMOS transistor Q36 turns off, causing the output of the read data $D_o$ as a signal at a high level, that is, at the potential of $V_{DD}$.

The description now concerns the case in which a low-level signal, that is, one at the ground potential GND is input to line r. Since the level of line r is low, the NMOS transistor Q34 turns off but the NMOS transistor Q31 turns on. The PMOS transistor Q32 turns off in accordance with the increase in potential of line k, so that the potential of line j falls towards ground. The PMOS transistor Q33 turns on as the potential of line j falls, and the potential of line k rises further. The potential of line k rises as far as $V_{DD}$. Note that, when the potential of line k reaches $V_{DD}$, the PMOS transistor Q32 turns off and thus a steady current does not flow from line j to line r through the PMOS transistor Q32.

Since the level of line k is high, the NMOS transistor Q36 turns on and the PMOS transistor Q35 turns off, causing the output of the read data $D_o$ as a signal at a low level, that is, at the ground potential GND.

As described above, the bus-line drive circuit of this invention can be used to completely solve the problems of operating errors due to a drop in the output voltage in a semiconductor storage device using low power supply voltage $V_{DD}$, and a reduction in the speed of charging of the bus line due to a drop in the current supply capability when the NMOS transistor turns on. This makes it possible to construct a more sophisticated semiconductor storage device.

Embodiment 2

Figure 6:
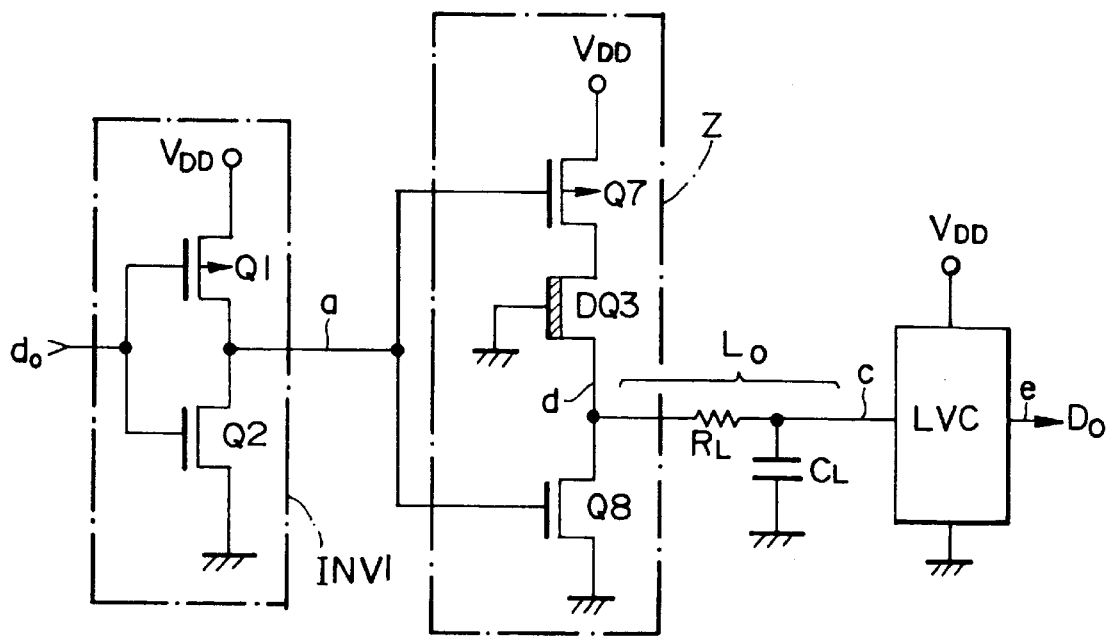
FIG. 6 is a schematic view of the bus-line drive circuit of Embodiment 2 of this invention.

The bus-line drive circuit of a second embodiment of this invention is shown in FIG. 6. In the circuit of this embodiment, the gate Potential of a depletion-mode NMOS transistor DQ3 is fixed at the ground voltage GND. This means that the depletion-mode NMOS transistor DQ3 does not have a large current supply capability immediately after a change in voltage level of the internal read data $d_o$ that is an input signal thereof, so that the speed of charging drops by t2 in comparison with Embodiment 1, as shown in FIG. 4. However, this embodiment has the advantage of not needing the delay circuit of FIG. 1.

The source of the PMOS transistor Q7 in this bus-line drive circuit is connected to the power supply voltage $V_{DD}$ and the drain thereof is connected to the drain of the depletion-mode NMOS transistor DQ3. The source of the depletion-mode NMOS transistor DQ3 is connected to the drain of the NMOS transistor Q8 by line d and the source of the NMOS transistor Q8 is grounded. Line d is connected to the elongated bus line $L_o$.

In other words, this bus-line drive circuit is characterized in the provision of this depletion-mode NMOS transistor DQ3 between the drain of the PMOS transistor Q7 and the drain of the NMOS transistor Q8. The elongated bus line $L_o$ is connected between the source of the depletion-mode NMOS transistor DQ3, and which is also connected at the drain of the NMOS transistor Q8.

In the same manner as in the circuit of FIG. 1, the signal output over the bus line $L_o$ (which is elongated and thus generates a load capacitance $C_L$ and load resistance $R_L$) is input to the level conversion circuit LVC.

It should be noted that, when this bus-line drive circuit is used for data output, for example, a circuit Z comprising the PMOS transistor Q7, the depletion-mode NMOS transistor DQ3, and the NMOS transistor Q8 is connected to an end portion of the bus line $L_o$ on the side of internal circuitry (a memory array), in a manner similar to that of Embodiment 1. When this bus-line drive circuit is used for data input, the circuit Z is connected to an end portion of the bus line $L_o$ on the side of an input buffer. A number of these bus-line drive circuits would be provided in practice to correspond to the number of bus lines within a semiconductor storage device, but the description below concerns only the drive circuit for the bus line $L_o$. The description below concerns the use of the bus-line drive circuit of this invention as a bus-line drive circuit for data output.

The operation of the circuit of FIG. 6 will now be described. The first case considered is that in which the level of the internal read data $d_o$ goes from low to high. When the potential level of the internal read data $d_o$ goes from low (GND=0 V) to high ($V_{DD}$=5 V), the potential of line a goes low in correspondence with the rising of the internal read data $d_o$. This turns the PMOS transistor Q7 on and the NMOS transistor Q8 off. Since the gate of the depletion-mode NMOS transistor DQ3 is always fixed to the ground potential GND, the source potential of the depletion-mode NMOS transistor DQ3 is the absolute value $V_{thd}$ of the threshold voltage. This charges bus line $L_o$ to Vc, that is, until it reaches the absolute value $V_{thd}$ of the threshold voltage. If the threshold voltage of the first-stage circuit within the level conversion circuit LVC is set to be at Vc/2, and when the potential of line c rises past Vc/2, the level conversion circuit LVC converts the potential of line c into high level, that is, into the level of the power supply voltage $V_{DD}$, and then outputs it as the read data $D_o$ from the data output terminal (not shown in the figure) for transfer to the external device.

The case in which the internal read data $d_o$ goes low will now be described.

When the potential of the internal read data $d_o$ goes from high ($V_{DD}$=5 V) to low (GND=0 V), the potential of line a goes high in correspondence with the falling of the internal read data $d_o$. This turns the NMOS transistor Q8 on and the PMOS transistor Q7 off. As a result, the potential of the bus line $L_o$ goes to ground If the threshold voltage of the transistors comprised in the first-stage circuit within the level conversion circuit LVC is set to be at Vc/2, and when the potential of line c falls past Vc/2, the level conversion circuit LVC, the potential of line c into low level, that is, to the ground potential GND, and then outputs that signal as the read data $D_o$ from the data output terminal (not shown in the figure) for transfer to the external device.

In the description above, the gate potential of the depletion-mode NMOS transistor DQ3 is fixed to ground, but it need not necessarily be fixed to this level; it can equally well be fixed to any other potential Vd that is less than the power supply voltage $V_{DD}$. In such a case, the potential Vc of line c would be increased by approximately Vd. This increases the current consumption by that amount, but the speed of charging also increases.

Similarly, the gate of the depletion-mode NMOS transistor DQ3 could be connected to gate signals of the PMOS transistor Q7 and the NMOS transistor Q8, to obtain an effect similar to that of the bus-line drive circuit of FIG. 1.

Although the drain of the NMOS transistor Q8 in Embodiment 2 was described as being connected to the bus line $L_o$, the drain of the PMOS transistor Q7 could be connected thereto instead, reducing the power consumption to below that of the circuit of FIG. 2.

In this manner, the bus-line drive circuit of this embodiment makes it possible to do without a delay circuit and supply a power source that is independent of the power supply voltage, so that a smaller chip can be constructed and more convenient operating conditions can be obtained, with no need to set a delay time.

This embodiment has been described as a bus-line drive circuit for data output, by way of example, but similar effects can be obtained when this bus-line drive circuit is provided as a circuit for data input, in the same manner as that described above for Embodiment 1.

Embodiment 3

Figure 7:
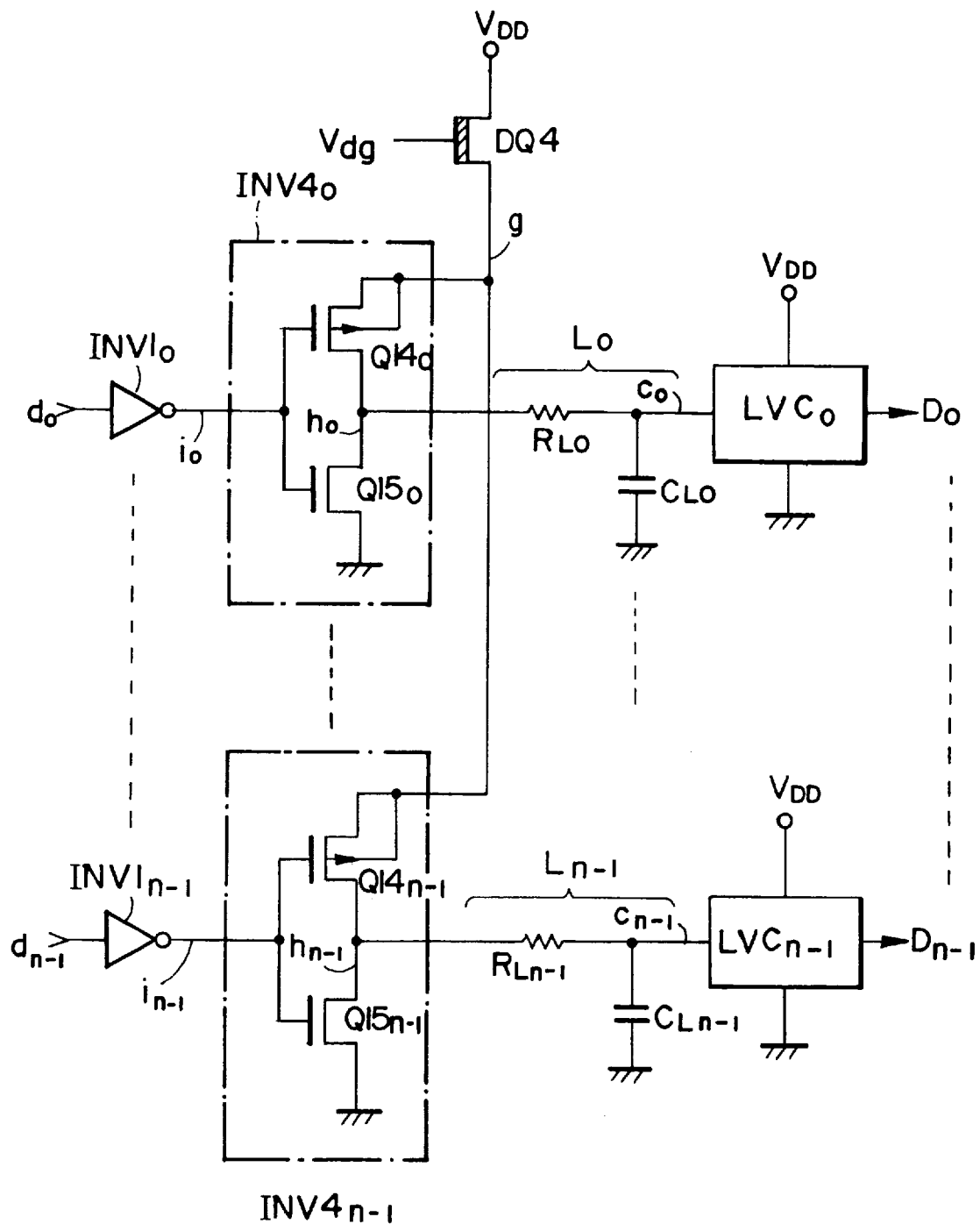
FIG. 7 is a schematic view of the bus-line drive circuit of Embodiment 3 of this invention.

The bus-line drive circuit of a third embodiment of this invention is shown in FIG. 7.

This circuit comprises a current supply source, n inverters $INV1_o$ to $INV1_{n-1}$ consisting of CMOS transistors and receiving corresponding internal read data $d_o$ to $d_{n-1}$, n inverters $INV4_o$ to $INV4_{n-1}$ consisting of CMOS transistors, and n bus lines $L_o$ to $L_{n-1}$ that receive outputs from the corresponding inverters $INV4_o$ to $INV4_{n-1}$. These inverters $INV1_o$ to $INV1_{n-1}$ could have the same configuration as the inverter INV1 of FIG. 1. The current supply source comprises a depletion-mode NMOS transistor DQ4, the power supply voltage $V_{DD}$ is supplied to the drain of the depletion-mode NMOS transistor DQ4, and a fixed voltage Vdg that is less than the power supply voltage $V_{DD}$ is applied to the gate thereof. Since the depletion-mode NMOS transistor DQ4 is configured of a single transistor for the plurality of bus lines $L_o$ to $L_{n-1}$, it must have a current drive capability that can cover all n bus lines and be capable of driving P-wells for creating PMOS transistors $Q14_o$ to $Q14_{n-1}$. In other words, when all of the bus lines $L_o$ to $L_{n-1}$ are at high, a depletion-mode NMOS transistor DQ4 that is too small would have a potential that rises gently, so that a current drive capability that is sufficient for the number of bus lines (n lines) is necessary. Since each N well junction is extended, the depletion-mode NMOS transistor must at least have the capability of driving N wells each of which has the junction capacitance and load capacitance.

The internal read data $d_o$ is input to the inverter $INV1_o$ and an output from $INV1_o$ (line $i_o$) is input to the inverter INV4$_o$. The inverter INV4$_o$ is configured of the PMOS transistor Q14$_o$ and an NMOS transistor Q15$_o$. The source of the PMOS transistor Q14$_o$ is connected to the substrate and this source is also connected to the source of the depletion-mode NMOS transistor DQ4 by a line g. The drain of the NMOS transistor Q15$_o$ 1s connected to the drain of the PMOS transistor Q14$_o$ by a line h$_o$ and the ground voltage GND is applied to the source of the NMOS transistor Q15$_o$. The bus line L$_o$ is connected to an output of the inverter INV4$_o$, that is, to the line h$_o$ that connects the drains of the PMOS transistor Q14$_o$ and the NMOS transistor Q15$_o$. The circuits that receive the data from the others of the n lines of internal read data d$_o$ to d$_{n-1}$ are configured in the same manner, so only d$_o$ and d$_{n-1}$ are shown in FIG. 7 to avoid confusion.

The n groups of circuits comprising the inverters INV1$_o$ and INV4$_o$, etc., could be used as bus-line drive circuit for data output, for example, in which case they would be connected to the end portions of the n bus lines (L$_o$ to L$_{n-1}$) on the side of internal circuitry la memory array). If these inverters were to be used as bus-line drive circuits for data input, on the other hand, they would be connected to the other end portions of the bus lines on the side of an input buffer. The description below concerns the operation when the bus-line drive circuit of this invention is used as a bus-line drive circuit for data output. The first case is that in which the level of the internal read data d$_o$ goes high.

Since the gate of the depletion-mode NMOS transistor DQ4 is always fixed at the potential Vdg, which is lower than the power supply voltage V$_{DD}$ that is the drain voltage, the source potential of the depletion-mode NMOS transistor DQ4, which is the potential of line g, is the sum of the voltage Vdg applied to the gate of the depletion-mode NMOS transistor DQ4 and the absolute value V$_{thd}$ of the threshold voltage thereof, that is, at the potential of (Vdg+V$_{thd}$). This potential (Vdg+V$_{thd}$) of line g is supplied as the power supply voltage to all of the inverters from INV4$_o$ to INV4$_{n-1}$.

If the potential of the internal read data d$_o$ changes from low (GND=0 V) to high (V$_{DD}$=5 V), the output of INV1$_o$ goes low level, turning the PMOS transistor Q14$_o$ on. The NMOS transistor 15$_o$ then turns off. Therefore, lines h$_o$ and c$_o$ of the bus line L$_o$, which is at the ground potential GND, are charged until they reach this potential (Vdg+V$_{thd}$).

When the potential of line c$_o$ rises towards (Vdg+V$_{thd}$), a level conversion circuit LVC$_o$ outputs a signal at the high level, that is, at the power supply voltage V$_{DD}$ level as the read data D$_o$ through the data output terminal (not shown in the figure) and the read data D$_o$ is thus transferred to the external device.

The description now turns to the case in which the level of the internal read data d$_o$ changes from high to low.

In this case, when the potential of the internal read data d$_o$ changes from high (V$_{DD}$=5 V) to low (GND=0 V), the output of INV1$_o$ goes high so that the PMOS transistor Q14$_o$ turns off. The NMOS transistor Q15$_o$ turns on. Therefore the load of line c$_o$ of the bus line L$_o$, which was charged to (Vdg+V$_{thd}$) is discharged so that the potential of line c$_o$ falls to the ground voltage.

When the potential of line c$_o$ falls to ground, the level conversion circuit LVC$_o$ outputs a signal at the low level, that is, at the ground potential GND level as the read data D$_o$ through the data output terminal (not shown in the figure) and the read data D$_o$ is thus transferred to the external device.

In this manner, the bus-line drive circuit of this embodiment makes it possible to do without a delay circuit and also enables a reduction in the number of components in comparison with Embodiment 2. Moreover, a signal of a predetermined amplitude (voltage level) can be shaped irrespective of the power supply voltage of the semiconductor device, so that a smaller chip can be constructed and more convenient operating conditions can be obtained, with no need to set a delay time.

This embodiment was described above as a bus-line drive circuit for data output, by way of example, but similar effects can be obtained when this bus-line drive circuit is provided as a circuit for data input, in the same manner as that described above for Embodiment 1.

Embodiment 4

Figure 11:
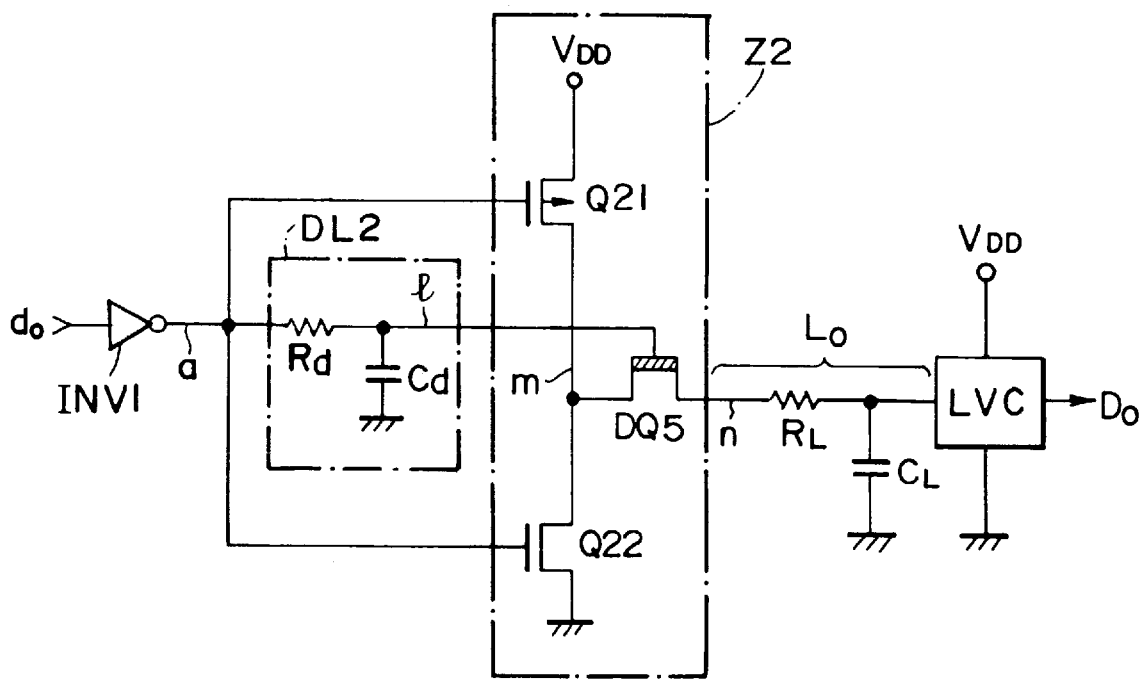
FIG. 11 is a schematic view of a bus-line drive circuit that is Embodiment 4 of this invention.

The bus-line drive circuit of a fourth embodiment of this invention is shown in FIG. 11. The internal read data d$_o$ is input to the inverter INV1 and an output of this inverter INV1 is connected to the gate of a PMOS transistor Q21, a delay circuit DL2, and the gate of an NMOS transistor Q22. The source of the PMOS transistor Q21 is connected to V$_{DD}$ and the drain is connected to the drain of the NMOS transistor Q22 by line m. The source of the NMOS transistor Q22 is connected to ground, and the PMOS transistor Q21 and NMOS transistor Q22 together configure an inverter with an output line m. The delay circuit DL2 is configured in the same manner as the delay circuit DL of FIG. 1. A line l which is an output of the delay circuit DL2 is connected to the gate of a depletion-mode NMOS transistor DQ5, line m is connected to one electrode of the depletion-mode NMOS transistor DQ5, and the other electrode of the depletion-mode NMOS transistor DOS is connected to one end of the bus line L$_o$ by a line n. The inverter INV1, the bus line L$_o$, and the level conversion circuit LVC have the same configurations as those shown in FIG. 1.

The operation of the circuit shown in FIG. 11 will now be described. When the level of the internal read data d$_o$ goes high, the level of line a goes low and thus the PMOS transistor Q21 turns on and the level of line m reaches V$_{DD}$. Line l is set to go low after a time corresponding to the delay of the delay circuit DL2 has elapsed. Because the potential of line l is held at V$_{DD}$, the depletion-mode NMOS transistor DQ5 pulls up the potential of line n to the potential of line m, that is, to the V$_{DD}$ level. This means that the depletion-mode NMOS transistor DQ5 has a large current supply capability, enabling it to charge the bus line L$_o$ rapidly.

As the delay time of the delay circuit DL2 elapsed and the charging of the bus line L$_o$ progresses, the potential of line l, that is, the potential at the gate of the depletion-mode NMOS transistor DQ5, falls to low. While the depletion-mode NMOS transistor DQ5 is charging the bus line L$_o$, the depletion-mode NMOS transistor DQ5 gradually turns off as the gate potential thereof falls to ground. When the potential of line n of the bus-line L$_o$ reaches the absolute value V$_{thd}$ of the threshold voltage of the depletion-mode NMOS transistor DQ5, the charging halts. Therefore, the potential of the bus line L$_o$ is at V$_{thd}$ of the depletion-mode NMOS transistor DQ5.

The description now turns to the case in which the level of the internal read data d$_o$ changes from high to low. When the internal read data d$_o$ goes low, line a is high so that the PMOS transistor Q21 turns off and the NMOS transistor Q22 turns on, bringing line m to the ground potential GND level. Line l goes high after a time corresponding to the delay of the delay circuit DL2 has elapsed, but, since line m is at the ground potential GND level, the depletion-mode NMOS transistor DQ5 is sufficiently conductive and the load on the bus line L$_o$ is discharged rapidly The potential of the bus line L$_o$ then falls to the around potential GND.

Note that, if the drive capability of the depletion-mode NMOS transistor DQ5 is sufficiently higher than the drive capabilities of the MOS transistors Q21 and Q22, the placement thereof between one end of the bus line $L_o$ and line m does not cause any problems.

Since the potential of the bus line $L_o$ in this embodiment is also dependent only on the threshold voltage of the depletion-mode NMOS transistor DQ5, as described above, it is not affected by the power supply voltage and thus it is possible to guarantee a low-voltage operating margin and drive the bus line rapidly. Therefore, the bus-line drive circuit of this invention can be used to completely solve the problems of operating errors due to a drop in the output voltage in a semiconductor storage device using lower power supply voltage $V_{DD}$, and a reduction in the speed of charging of the bus line due to a drop in the current supply capability when the NMOS transistor turns on. This makes it possible to construct a more sophisticated semiconductor storage device.

Embodiment 5

Figure 8:
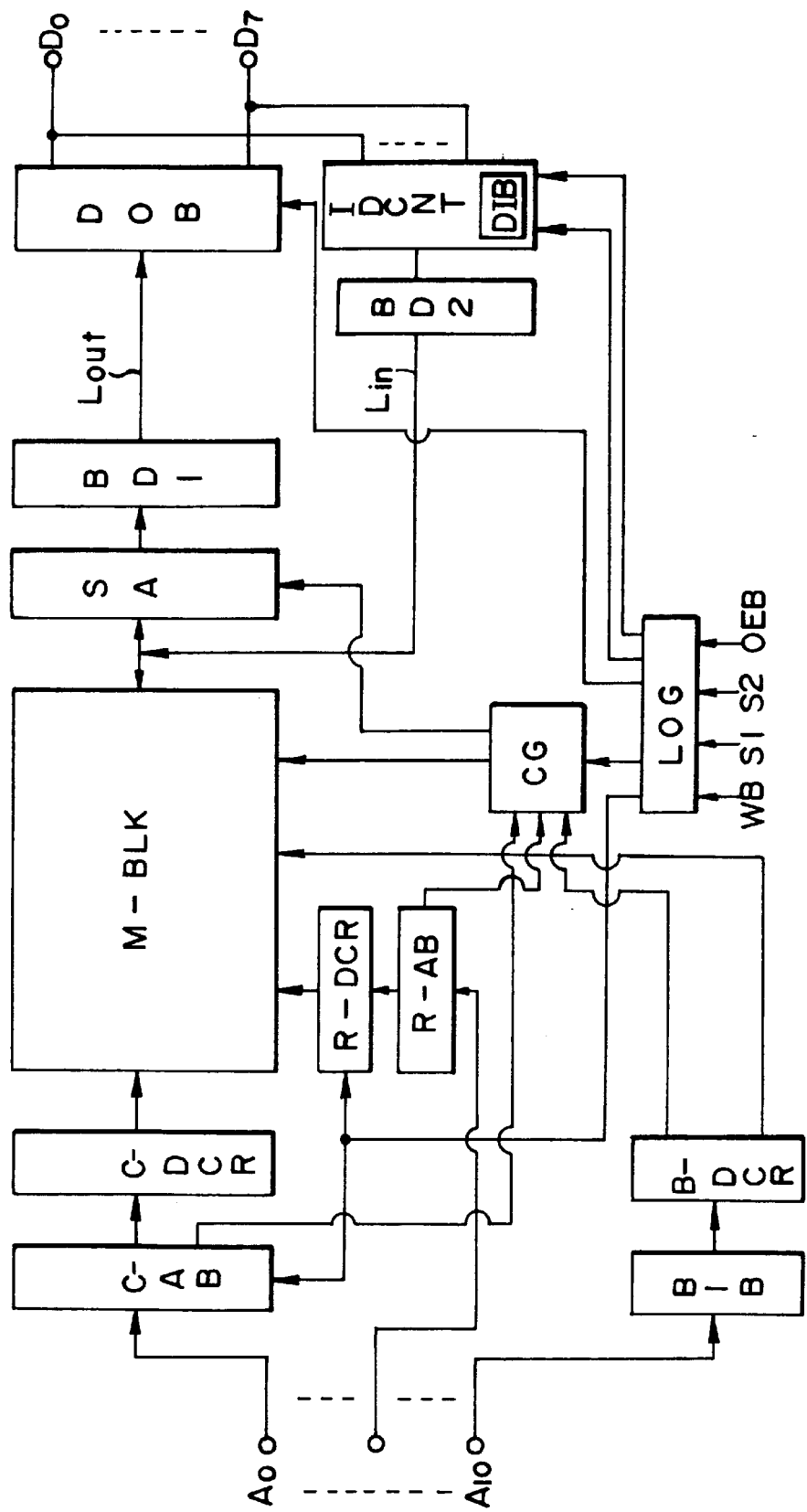
FIG. 8 is a functional block diagram of a static RAM in which the bus-line drive circuit of this invention is installed.

A function block diagram of the bus-line drive circuit of this invention applied to a semiconductor storage device such as a static RAM (hereinafter abbreviated to SRAM) is shown in FIG. 8. By way of example, this embodiment concerns SRAM having a 1-megabit storage capacity and a data width of 8 bits. It is configured of a plurality of memory blocks M-BLK, but further descriptions of irrelevant functions of the other circuits such as redundancy circuits are omitted.

This SRAM comprises these memory blocks M-BLK, and each of these memory blocks M-BLK comprises a plurality of word lines, a plurality of data line pairs, and a plurality of static memory cells provided at intersections between the individual word lines and individual data line pairs, although these components are not shown in the figure. The SRAM further comprises address terminals $A_0-A_{10}$ to which are input an address signal, a column address buffer C-AB for fetching this address signal as a column address signal, and a column address decoder C-DCR for decoding the column address signal and specifying a column address within these memory blocks. There are also a row address buffer R-AB for fetching the address signal as a row address signal, and a row address decoder R-DCR for decoding the row address signal and specifying a row address within these memory blocks. A block input buffer BIB for fetching the address signal as a block address signal and a block pre-decoder B-DCR for predecoding the block address signal and selecting one memory block from amongst this plurality of memory blocks. In addition, the SRAM still comprises a plurality of sense amplifiers SA for amplifying write data to those memory blocks or read data from those memory blocks, data input-output terminals $D_0$ to $D_7$ that are used for both input and output to receive external data or output stored data, and a clock generator CG for generating timing control signals that control the operational timing of these circuits by a write control signal WB, an output enable signal OEB, and chip-select signals S1 and S2 that are input through external terminals. There are also a data output buffer DOB controlled by the output enable signal during data output, for fetching internal read data $d_{out}$ that has been read from a memory cell via the sense amplifier and transferring this internal read data to the data input-output terminals through data output bus lines $L_{out}$; a data input buffer DIB controlled by the write control signal during data input, for fetching write data $D_{in}$ from the data input-output terminals and transferring this write data to the sense amplifier through data input bus lines $L_{in}$; a plurality of bus lines provided between these circuits; and a bus-line drive circuit provided at one end of each of some or all of these bus lines. There is also an input data control circuit IDCNT comprising the data input buffer DIB.

A number of first bus-line drive circuits BD1 corresponding to the number of the data output bus lines $L_{out}$, each having the same structure as the bus-line drive circuit of FIG. 1, are provided at the output end portion of the sense amplifier SA to ensure that the voltage amplitude of the plurality of data output bus lines $L_{out}$ is small. Although not shown in the figure, a first stage of this output buffer DOB comprises a plurality of the level conversion circuits LVC shown in FIG. 5.

A number of second bus-line drive circuits BD2 corresponding to the number of the plurality of data input bus lines $L_{in}$, and each having the same structure as the bus-line drive circuit of FIG. 1, are provided at an output portion of the input data control circuit IDCNT to ensure that the voltage amplitude of the plurality of data input bus lines $L_{in}$ is small.

The data write operation in the SRAM of this embodiment will first be described. The addresses of the cells in which this data is to be written are input from the address terminals $A_0$ to $A_{16}$, the data to be written is input from the data input-output terminals, and a signal of a predetermined level at a predetermined timing, such as the write control signal WB is input to Perform the write operation. Write data $D_{in}$ is input through the data input-output terminals $D_0$ to $D_7$, then this write data $D_{in}$ is input to the input data control circuit IDCNT. The input data control circuit IDCNT buffers the write data $D_{in}$, then internal write data $d_{in}$ is written to the memory cell at the specified address, on the basis of an output signal from the input data control circuit IDCNT.

During the write to the specified address, the output portion of the input data control circuit IDCNT is connected to the second bus-line drive circuit BD2 and the data is written via the data input bus line $L_{in}$. For that reason, each data input bus line $L_{in}$ acts as a signal line for transferring the data, and thus the signal transfer speed and accuracy thereof is vital to the SRAM. However, since the load capacitance and load resistance of each data input bus line $L_{in}$ is reduced by the use of the second bus-line drive circuit BD2, charging and discharging occur rapidly. Thus the SRAM of this embodiment has a rapid signal transfer speed and the operation of the circuitry itself is not adversely affected thereby. The SRAM of this embodiment not only enables a reduction in the power consumption, even when a lower power supply voltage $V_{DD}$ is used, it also makes it possible to input data rapidly.

The operation of outputting (reading) data from the SRAM of this embodiment will now be described. The address selection method used is the same as that of the write operation described above, so a detailed description there is omitted and the operation described below starts after the address has been selected.

Internal read data $d_{out}$ is fetched by the sense amplifier SA, which amplifies the tiny voltages thereof. This internal read data $d_{out}$ is transferred through the data output bus line $L_{out}$ to the data output buffer DOB. Note that each first bus-line drive circuit BD1 is provided at the output end portion of each sense amplifier SA and each level conversion circuit LVC is comprised at the input end portion of the data output buffer DOB, so that the internal read data $d_{out}$ is fetched into the level conversion circuit LVC via the data output bus line $L_{out}$. In this case, a load capacitance and load resistance are created within the data output bus line $L_{out}$, but loads are reduced by charging and discharging the data output bus line $L_{out}$ by the first bus-line drive circuit BD1, so that a lower power consumption can be expected during data read. This read data $D_{out}$ is output from the data output terminals $D_0$ to $D_7$.

During this time, each data output bus line $L_{out}$ acts as a signal line for transferring the data, and thus the signal transfer speed and accuracy thereof is vital to the SRAM. However, since the load capacitance and load resistance of this data output bus line $L_{out}$ is reduced by the use of the first bus-line drive circuit BD1, charging and discharging occur rapidly. Thus the SRAM of this embodiment has a rapid signal transfer speed and the operation of the circuitry itself is not adversely affected thereby. The SRAM of this embodiment not only enables a reduction in the power consumption, even when a lower power supply voltage $V_{DD}$ is used, it also makes it possible to input data rapidly.

In this manner, the application of the bus-line drive circuit of FIG. 1 to the first and second bus-line drive circuits of the SRAM enables reductions in power consumption during data read and write. Since the data transfer is so rapid through the data input and output bus lines during the data read and write, the applicability of this SRAM can be improved. For that reason, this embodiment can be used in a high-speed storage device accommodated within a computer, making it possible to satisfy demands for high-speed operation in that field.

The bus-line drive circuit of this invention was described in this embodiment as being used for both of the data input buffer and the data output buffer, but it should be clear that the present invention is not limited thereto and it can be used in either buffer alone.

Similarly, although the SRAM of this embodiment was described by way of example as using the bus-line drive circuit of FIG. 1 in the first and second bus-line drive circuits, the bus-line drive circuit of FIG. 7 or FIG. 5 could equally well be used in the first and second bus-line drive circuits of the SRAM of this embodiment. If, for example, the bus-line drive circuit of FIG. 5 is applied to the first and second bus-line drive circuits so the SRAM of this embodiment, the lack of delay circuits will make it possible to reduce the scale of the peripheral circuits of the storage device, which is useful for an SRAM which tends to have a large number of components, and which also makes it possible to reduce the power consumption of the SRAM. Similarly, if, for example, the bus-line drive circuit of FIG. 7 is applied to the first and second bus-line drive circuits of the SRAM of this embodiment, the number of circuit components can be greatly reduced, enabling installation within a microcomputer and also making it possible to obtain an SRAM that has a lower power consumption and a faster operating speed.

The bus-line drive circuit of this invention can also be used to drive other types of bus line. For instance, it could be used for the address bus within a semiconductor storage device, the data or address bus within a microprocessor, or a bus line for display data in a display control device.

Embodiment 6

Figure 9:
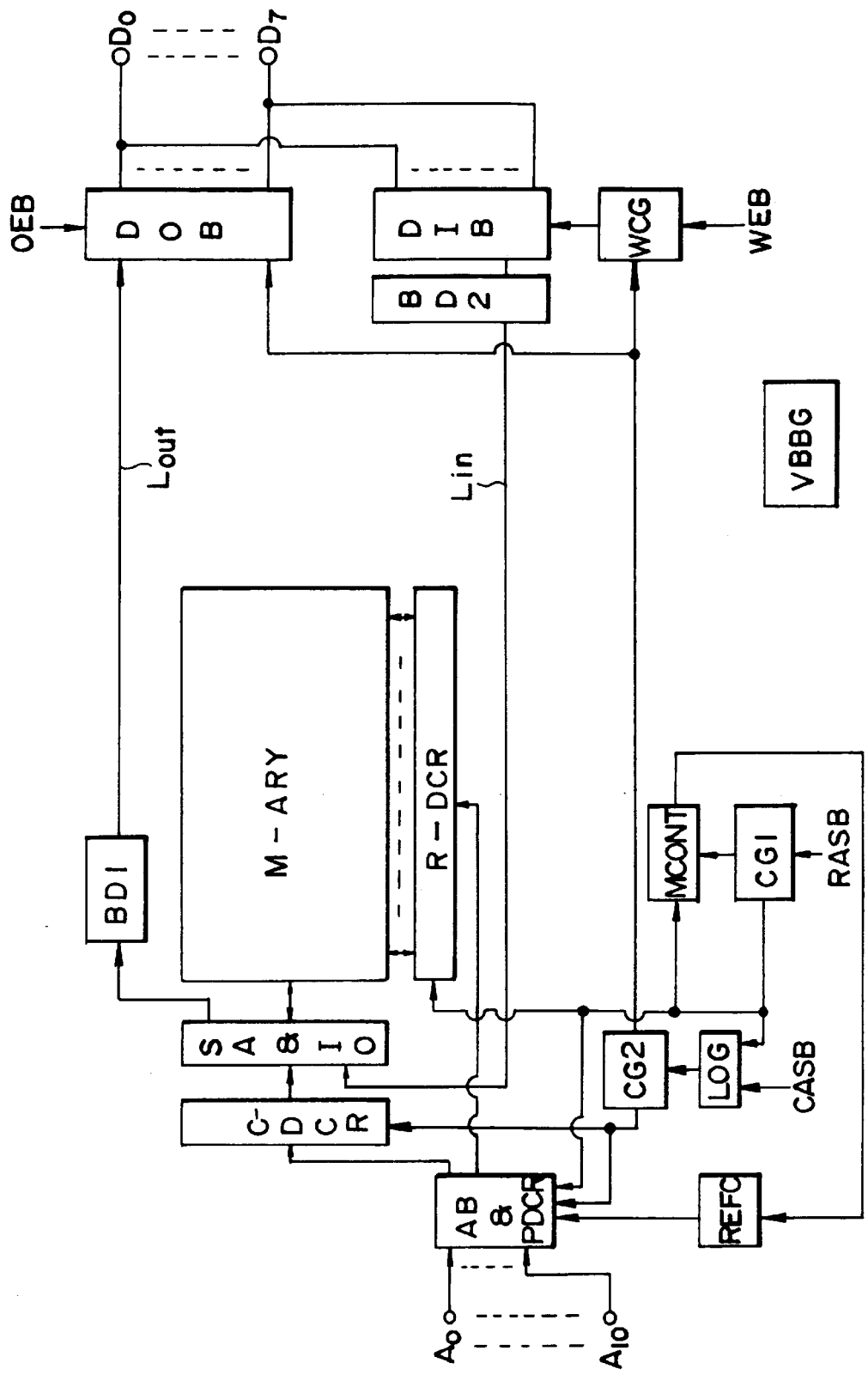
FIG. 9 is a functional block diagram of a dynamic RAM in which the bus-line drive circuit of this invention is installed.

A function block diagram of the bus-line drive circuit of this invention applied to a semiconductor storage device, which is dynamic RAM in this particular case, is shown in FIG. 9. By way of example, this embodiment concerns dynamic RAM (hereinafter abbreviated to DRAM) having a 16-megabit storage capacity. It is configured of a plurality of memory arrays. Further descriptions of irrelevant functions of the other circuits such as a redundancy circuit are omitted.

The semiconductor storage device of this embodiment comprises a memory array M-ARY comprising a plurality of bit line pairs, a plurality of word lines, and a plurality of dynamic memory cells provided at intersections between these word lines and bit line pairs; address terminals $A_0$ to $A_{10}$ to which are input an address signal; a column address buffer AB for fetching the address signal as a column address signal, and column address pre-decoder PDCR and column address decoder C-DCR for decoding the column address signal and specifying a column address within the memory array, an address buffer AB comprising a column address buffer and a row address buffer which are selected by switching a multiplexer; an pre-decoder PDCR comprising a column address pre-decoder and a row address pre-decoder; a row address buffer AB for fetching the address signal as a row address signal, a row address pre-decoder PDCR and a row address decoder R-DCR for decoding the row address signal and specifying a row address within the memory array; a plurality of sense amplifiers SA for amplifying write data to this memory array or read data from the memory array; and data input-output terminals $D_0$ to $D_7$ that are used for both input and output to receive external data or output stored data. The device also comprises row-related, column-related, and write-related clock generators CG1, CG2, and WCG that set the mode of the dynamic RAM in accordance with combinations of a column address strobe signal CASB, row address strobe signal RASB, and write enable signal WEB that are input from external terminals, and also generate timing control signal for controlling the operation timing of the various circuits. There are also a data output buffer DOB controlled by an output enable signal OEB during data output, for fetching read data that has been read from a memory cell via the sense amplifier and transferring this read data to the data input-output terminals over the data output bus line $L_{out}$; a data input buffer DIB controlled by the write enable signal during data input, for fetching write data from the data input-output terminals and transferring this write data to the sense amplifier over the data input bus line $L_{in}$; a plurality of bus lines provided between these circuits: and a bus-line drive circuit provided at one end of each of these bus lines.

A first bus-line drive circuit BD1 having the same structure as the bus-line drive circuit of FIG. 1 is provided at the output end portion of the sense amplifier SA. The data output buffer DOB and the first bus-line drive circuit BD1 are connected together by the data output bus line $L_{out}$. The level conversion circuit LVC (not shown in the figure) of FIG. 5 is comprised in the input end portion of the data output buffer DOB.

The write clock generator WCG is controlled by the write enable signal WEB, and an output portion of the data input buffer DIB is connected to a second bus-line drive circuit BD2. This second bus-line drive circuit BD2 has the same structure as the bus-line drive circuit of FIG. 1. It is connected to an input-output gate IO by the data input bus line $L_{in}$.

The data output buffer DOB is connected to the clock generator CG2 and its operation is controlled by the output enable signal OEB. The data input buffer DIB and the data output buffer DOB are each connected to the data input-output terminals $D_0$ to $D_7$. These data input-output terminals are used in common for both data input and data output.

This DRAM also comprises a refresh counter REFC, to generate a refresh signal that directs to refresh the data at fixed time intervals. A substrate bias generator VBBG acts to pull the potential of the substrate down to a negative value.

In this case, during the reading/writing of data with respect to the memory cells, a bit line pair at a specified address is selected by a column switch CW provided between the sense amplifier SA and the memory array M-ARY (not shown in the figure), the potential of that bit line pair is sensed by the column address decoder C-DCR, and the corresponding voltage is amplified by the sense amplifier SA.

The data write operation in the DRAM of this embodiment will first be described. The addresses of the cells in which this data is to be written are input from the address terminals $A_0$ to $A_{10}$ at a predetermined timing, the data to be written is input to the data input-output terminals, and the write is performed by inputting a signal of a predetermined level at a predetermined timing, such as the write control signal WB. The write data $D_{in}$ is input through the data input-output terminals $D_0$ to $D_7$ and is fetched to the data input buffer DIB. Note that column and row addresses are fetched to the column or row address buffer A e and the column or row address pre-decoder PDCR by switching a multiplexer, although this is not shown specifically in the figure. These operations specify each of the column and row addresses, to select a memory cell formed at the intersection of the selected word line and bit line pair.

The write data $D_{in}$ that is input to this data input buffer DIB is then input to the second bus-line drive circuit BD2, and the write data $D_{in}$ is output to the input-output gate IO and the sense amplifier SA through the data input bus line $L_{in}$ as the internal write data $d_{in}$. The tiny voltage of this internal write data $d_{in}$ is amplified by the sense amplifier SA and the internal write data d in is written to the memory cell at the specified address over the bit line pair.

In the DRAM of this embodiment, the signal amplitude of the internal write data $d_{in}$ transferred by the data input bus line $L_{in}$ from the data input buffer DIB to the sense amplifier SA is reduced by the second bus-line drive circuit BD2, so that the bus line $L_{in}$ between the data input buffer DIB and the sense amplifier SA is charged rapidly and with a low power consumption. The sense amplifier SA amplifies this internal write data $d_{in}$ and the internal write data $d_{in}$ is written to the selected memory cell via the input-output gate IO.

In this embodiment, the data input bus line $L_{in}$ in particular acts as signal line for transferring the data, and thus the signal transfer speed and accuracy thereof is vital to the DRAM. However, since the load capacitance and load resistance of this data input bus line $L_{in}$ is reduced by the use of the second bus-line drive circuit BD2, charging and discharging occur rapidly. Thus the DRAM of this embodiment has a rapid signal transfer speed and the operation of the circuitry itself is not adversely affected thereby. The DRAM of this embodiment not only enables a reduction in the power consumption, even when a low-voltage specification power supply voltage $V_{DD}$ is used, it also makes it possible to input data rapidly.

The operation of reading data from the DRAM of this embodiment will now be described.

Since address specification can be performed in the same manner as in data write, only the data transfer path will be describe below.

The read data $d_{out}$ stored in the memory cell at the selected address is read over the bit line pair via the input-output gate IO, is amplified by the sense amplifier SA, then is fetched to the first bus-line drive circuit BD1. The potential of the internal read data $d_{out}$ is converted by the first bus-line drive circuit BD1 to have a small amplitude. This lowers the potential on the data output bus line $L_{out}$ connected to the output portion of the first bus-line drive circuit, so that the data output bus line $L_{out}$ can be charged and discharged rapidly The internal read data $d_{out}$ is input to the data output buffer DOB connected to the data output bus line $L_{out}$, that is, the internal read data $d_{out}$ is input to a level conversion circuit (not shown in the figure) provided in the input stage of the data output buffer DOB. Since the data output bus line $L_{out}$ is configured of elongated wiring as described above, a load resistance and load capacitance are created therein, but the internal read data $d_{out}$ can be transferred rapidly to the data output buffer DOB because the data output bus line $L_{out}$ is charged and discharged so rapidly. This read data $D_{out}$ is buffered in the data output buffer DOB, then is output from the data input-output terminals $D_o$ to $D_7$.

In this manner, the data output bus line $L_{out}$ acts as signal line for transferring the data, and thus the signal transfer speed and accuracy thereof is vital to the DRAM. However, since the load capacitance and load resistance of this data output bus line $L_{out}$ is reduced by the use of the first bus-line drive circuit BD1, charging and discharging occur rapidly. Thus the DRAM of this embodiment has a rapid signal transfer speed and the operation of the circuitry itself is not adversely affected thereby. The DRAM of this embodiment not only enables a reduction in the power consumption, even when a low-voltage specification power supply voltage $V_{DD}$ used, it also makes it possible to input data rapidly.

In this manner, the application of the bus-line drive circuit of FIG. 1 to the first and second bus-line drive circuits of the DRAM enables reductions in power consumption during data read and write. Since the data transfer is so rapid through the data input and output bus lines during the data read and write, the functionality of this DRAM can be improved. This enables the dynamic RAM of this embodiment to be utilized over a wide range of fields, answering demands for DRAM that is faster and has a lower power consumption.

The bus-line drive circuit of this invention was described in this embodiment as being used for both of the data input buffer and the data output buffer, but it should be clear that the present invention is not limited thereto and it can be used in either buffer alone.

Similarly, the bus-line drive circuit of this invention can be used as a power supply circuit for other types of circuits. For instance, the bus-line drive circuit of this invention could be provided in an end portion of a power supply line of a precharge circuit, as a power supply circuit for the precharge circuit, to generate a voltage that is approximately half that of the power supply voltage. In this case, it would be necessary to adjust the threshold voltage of the depletion-mode NMOS transistor during the fabrication process. It should be obvious to those skilled in the art that this bus-line drive circuit can be applied to any kind of circuit that requires a power source that is less than another power supply voltage.

The DRAM of this embodiment was described above as using the bus-line drive circuit of FIG. 1, but the bus-line drive circuit of FIG. 5 or 7 could equally well be applied thereto. If, for example, the bus-line drive circuit of FIG. 5 is applied to the DRAM of this embodiment, the lack of delay circuits will make it possible to reduce the scale of the peripheral circuits of the storage device, thus enabling a DRAM that is compact and has a low power consumption. Similarly, if, for example, the bus-line drive circuit of FIG. 7 is applied to the DRAM of this embodiment, the number of circuit components can be greatly reduced, enabling the provision of a large-capacity and also making it possible to obtain a DRAM that has a lower power consumption and a faster operating speed.

The bus-line drive circuit of this invention is not limited to application in SRAM and DRAM; it can equally well be applied to other types of memory such as mask ROM, programmable ROM (PROM), or non-volatile memory (EEPROM). In such a case, since a plurality of depletion-mode MOS transistors are used within the memory array, a process of fabricating depletion-mode MOS transistors can be used to also form the depletion-mode MOS transistors in the bus-line drive circuit. This ensures that there is no particular increase in the number of fabrication steps, facilitating the fabrication of such storage devices.

What is claimed is:

1. A bus-line drive circuit comprising a transistor of a first conductivity type, a transistor of a second conductivity type, and a bus line;

wherein a depletion-mode transistor of said second conductivity type is connected between a drain of said transistor of said first conductivity type and a drain of said transistor of said second conductivity type, wherein one end of said bus line is connected to the drain of said transistor of said second conductivity type; and wherein a voltage that is less than a power supply voltage and greater than a threshold voltage of said depletion-mode transistor of said second conductivity type is applied to a gate of said depletion-mode transistor of said second conductivity type.

2. The bus-line drive circuit as defined in claim 1, wherein a signal that is input to a gate of said transistor of said first conductivity type is then delayed to be input to the gate of said depletion-mode transistor of said second conductivity type.

3. The bus-line drive circuit as defined in claim 1, wherein a signal of approximately the same phase as a signal that is input to a gate of said transistor of said first conductivity type is input to the gate of said depletion-mode transistor of said second conductivity type.

4. A bus-line drive circuit comprising a transistor of a first conductivity type, a transistor of a second conductivity type, and a bus line;

wherein a depletion-mode transistor of said second conductivity type is connected between a drain of said transistor of said first conductivity type and a drain of said transistor of said second conductivity type, wherein one end of said bus line is connected to the drain of said transistor of said second conductivity type; and wherein one of a ground voltage and other voltage which is lower than a power supply voltage is supplied to a gate of said depletion-mode transistor of said second conductivity type.

5. A bus-line drive circuit comprising a transistor of a first conductivity type, a transistor of a second conductivity type, and a bus line;

wherein a drain of said transistor of said first conductivity type, a drain of said transistor of said second conductivity type, and one end of said bus line are connected together;

wherein a depletion-mode transistor of said second conductivity type is connected between a source of said transistor of said first conductivity type and a power supply terminal; and wherein a voltage that is less than a power supply voltage and greater than a threshold voltage of said depletion-mode transistor of said second conductivity type is applied to a gate of said depletion-mode transistor of said second conductivity type.

6. The bus-line drive circuit as defined in claim 5, comprising a plurality of bus lines and a plurality of transistors of said first conductivity type;

wherein a source of said depletion-mode transistor of said second conductivity type is connected to sources of said plurality of transistors of said first conductivity type; and wherein said depletion-mode transistor of said second conductivity type has a power supply capability for driving said plurality of bus lines.

7. A bus-line drive circuit comprising a transistor of a first conductivity type, a transistor of a second conductivity type, and a bus line;

wherein a drain of said transistor of said first conductivity type is connected to a drain of said transistor of said second conductivity type;

wherein a depletion-mode transistor of said second conductivity type is connected between the drain of said transistor of said first conductivity type and one end of said bus line; and wherein a signal that is input to a gate of said transistor of said first conductivity type is then delayed to be input to a gate of said depletion-mode transistor of said second conductivity type.

8. A bus-line circuit comprising a level conversion circuit having a transistor of a first conductivity type and a transistor of a second conductivity type;

wherein a drain of said transistor of said first conductivity type is connected to a drain of said transistor of said second conductivity type;

wherein a depletion-mode transistor of said second conductivity type is connected between a source of said transistor of said first conductivity type and a power supply terminal; and wherein a signal from the drain of said transistor of said first conductivity type is input to a gate of said depletion-mode transistor of said second conductivity type.

9. A semiconductor storage device for writing predetermined data to a static memory cell through a bus line and for reading data stored in said static memory cell through said bus line, comprising a bus line drive circuit, wherein said bus line drive circuit comprises a transistor of a first conductivity type, a transistor of a second conductivity type, and said bus line;

wherein a depletion-mode transistor of said second conductivity type is connected between a drain of said transistor of said first conductivity type and one end of said bus line;

wherein said one end of said bus line is connected to a drain of said transistor of said second conductivity type; and wherein a voltage that is less than a power supply voltage and greater than a threshold voltage of said depletion-mode transistor of said second conductivity type is applied to a gate of said depletion-mode transistor of said second conductivity type.

10. The semiconductor storage device as defined in claim 9, further comprising a level conversion circuit to which is input an output signal from said bus-line drive circuit through said bus line;

wherein said level conversion circuit comprises a second transistor of said first conductivity type and a second transistor of said second conductivity type;

wherein a drain of said second transistor of said first conductivity type is connected to a drain of said second transistor of said second conductivity type;

wherein a second depletion-mode transistor of said second conductivity type is connected between a source of said second transistor of said first conductivity type and a power supply terminal; and wherein a signal from the drain of said second transistor of said first conductivity type is input to a gate of said second depletion-mode transistor of said second conductivity type.

11. The semiconductor storage device as defined in claim 9, comprising a plurality of sense amplifiers and a data input buffer;

wherein said bus-line drive circuit is provided at an output stage of said sense amplifier or at an output stage of said data input buffer.

12. The semiconductor storage device as defined in claim 9, wherein said bus-line drive circuit is used as a power supply circuit for supplying a voltage that is lower than a power supply voltage to said bus line.

13. The semiconductor storage device as defined in claim 9, comprising a plurality of sense amplifiers and a data output buffer;

wherein said data output buffer comprises a circuit for receiving read data transferred from said sense amplifiers and converting a voltage amplitude of said read data.

14. A semiconductor storage device for writing predetermined data to a dynamic memory cell through a bus line and for reading data stored in said dynamic memory cell through said bus line, comprising a bus-line drive circuit;

wherein said bus-line drive circuit comprises a transistor of a first conductivity type, a transistor of a second conductivity type, and said bus line;

wherein a depletion-mode transistor of said second conductivity type is connected between a drain of said transistor of said first conductivity type and one end of said bus line;

wherein said one end of said bus line is connected to a drain of said transistor of said second conductivity type; and wherein a voltage that is less than a power supply voltage and greater than a threshold voltage of said depletion-mode transistor of said second conductivity type is applied to a gate of said depletion-mode transistor of said second conductivity type.

15. The semiconductor storage device as defined in claim 14, further comprising a level conversion circuit to which is input an output signal from said bus-line drive circuit through said bus line;

wherein said level conversion circuit comprises a second transistor of said first conductivity type and a second transistor of said second conductivity type;

wherein a drain of said second transistor of said first conductivity type is connected to a drain of said second transistor of said second conductivity type;

wherein a second depletion-mode transistor of said second conductivity type is connected between a source of said second transistor of said first conductivity type and a power supply terminal; and wherein a signal that is output from the drain of said second transistor of said first conductivity type is input to a gate of said second depletion-mode transistor of said second conductivity type.

16. The semiconductor storage device as defined in claim 14, comprising a plurality of sense amplifiers and a data input buffer, wherein said bus-line drive circuit is provided at an output stage of said sense amplifiers or at an output stage of said data input buffer.

17. The semiconductor storage device as defined in claim 14, wherein said bus-line drive circuit is used as a power supply circuit for supplying a voltage that is lower than a power supply voltage to said bus line.

18. The semiconductor storage device as defined in claim 14, comprising a plurality of sense amplifiers and a data output buffer, wherein said data output buffer comprises a circuit for receiving read data transferred from said sense amplifiers and converting a voltage amplitude of said read data.

19. A semiconductor storage device, comprising:

a plurality of memory blocks each having a plurality of data line pairs, a plurality of word lines, and a plurality of static memory cells provided at intersections between said data line pairs and said word lines;

address terminals to which are input an address signal;

a column address buffer and a column address decoder for fetching said address signal and specifying a column address within said memory blocks;

a row address buffer and a row address decoder for fetching said address signal and specifying a row address within said memory blocks;

a block input buffer and a block pre-decoder for fetching said address signal and selecting one memory block from amongst said plurality of memory blocks;

a plurality of sense amplifiers for amplifying data to be written to said memory blocks or data read from said memory blocks;

data input terminals to which external data is input;

data output terminals from which stored data is output;

a clock generator for generating timing control signals that control an operational timing of circuits of the semiconductor storage device by a write control signal, an output enable signal, and chip-select signals that are input through external terminals;

a data output buffer controlled by said output enable signal during data output, for fetching read data that has been read from a memory cell via said sense amplifiers and transferring said read data to said data output term bus line;

a data input buffer controlled by said write control signal during data input, for fetching data to be written from said data input terminals and transferring said data to be written to said sense amplifiers through a data input bus line;

a plurality of bus lines provided between said circuits; and a plurality of bus-line drive circuits each of which is provided at one end of each of some or all of said bus lines; and wherein each of said bus-line drive circuits comprises a transistor of a first conductivity type, a transistor of a second conductivity type, and one of said bus lines;

wherein a depletion-mode transistor of said second conductivity type is connected between a drain of said transistor of said first conductivity type and one end of said one of said bus lines;

wherein said one end of said one of said bus lines is connected to a drain of said transistor of said second conductivity type; and wherein a voltage that is less than a power supply voltage and greater than a threshold voltage of said depletion-mode transistor of said second conductivity type is applied to a gate of said depletion-mode transistor of said second conductivity type.

20. A semiconductor storage device, comprising:

a plurality of memory arrays each having a plurality of bit line pairs, a plurality of word lines, and a plurality of dynamic memory cells provided at intersections between said bit line pairs and said word lines;

address terminals to which are input an address signal;

a column address buffer, a column address pre-decoder, and a column address decoder for fetching said address signal and specifying a column address within said memory arrays;

a row address buffer, a row address pre-decoder, and a row address decoder for fetching said address signal and specifying a row address within said memory arrays a plurality of sense amplifiers for amplifying data to be written to said memory arrays or data read from said memory arrays;

data input terminals to which external data is input;

data output terminals from which stored data is output;

row-related, column-related, and write-related clock generators for setting a mode of a dynamic RAM in accordance with combinations of a column address strobe signal, a row address strobe signal, and a write enable signal that are input from external terminals, and generating timing control signal for controlling an operation timing of circuits of the semiconductor storage device;

a data output buffer controlled by an output enable signal during data output, for fetching read data that has been read from a memory cell via said sense amplifiers and transferring said read data to said data output terminals through a data output bus line;

a data input buffer controlled by said write enable signal during data input, for fetching data to be written from said data input terminals and transferring said data to be written to the sense amplifiers through a data input bus line;

a plurality of bus lines provided between said circuits; and a plurality of bus-line drive circuits each of which is provided at one end portion of each of some or all of said bus lines;

wherein each of said bus-line drive circuits comprises a transistor of a first conductivity type, a transistor of a second conductivity type, and one of said bus lines;

wherein a depletion-mode transistor of said second conductivity type is connected between a drain of said transistor of said first conductivity type and one end of said one of said bus lines;

wherein said one end of said one of said bus lines is connected to a drain of said transistor of said second conductivity type; and wherein a voltage that is less than a power supply voltage and greater than a threshold voltage of said depletion-mode transistor of said second conductivity type is applied to a gate of said depletion-mode transistor of said second conductivity type.

* * * * *